United States Patent
Kim et al.

(10) Patent No.: US 12,034,107 B2
(45) Date of Patent: Jul. 9, 2024

(54) SUBSTRATE FOR MANUFACTURING DISPLAY DEVICE AND METHOD FOR MANUFACTURING DISPLAY DEVICE

(71) Applicant: LG ELECTRONICS INC., Seoul (KR)

(72) Inventors: Gunho Kim, Seoul (KR); Bongchu Shim, Seoul (KR); Youngdo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 328 days.

(21) Appl. No.: 17/619,852

(22) PCT Filed: Jul. 9, 2019

(86) PCT No.: PCT/KR2019/008443
§ 371 (c)(1),
(2) Date: Dec. 16, 2021

(87) PCT Pub. No.: WO2020/262751
PCT Pub. Date: Dec. 30, 2020

(65) Prior Publication Data
US 2022/0352445 A1 Nov. 3, 2022

(30) Foreign Application Priority Data
Jun. 28, 2019 (KR) .................. 10-2019-0078216

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/156* (2013.01); *H01L 33/005* (2013.01); *H01L 33/38* (2013.01);
(Continued)

(58) Field of Classification Search
CPC ..... H01L 33/62; H01L 27/156; H01L 33/005; H01L 33/38; H01L 2933/0016;
(Continued)

(56) References Cited

U.S. PATENT DOCUMENTS

| 6,356,106 B1 | 3/2002 | Greeff et al. |
| 9,329,433 B2 | 5/2016 | Negishi et al. |

(Continued)

FOREIGN PATENT DOCUMENTS

| JP | 2008-260073 A | 10/2008 |
| JP | 2012-4535 A | 1/2012 |

(Continued)

OTHER PUBLICATIONS

Edman et al. ("Electric Field Directed Assembly of an InGaAS LED onto Silicon Circuitry," IEEE Photonics Technology Letters, vol. 12, No. 9, Sep. 2000) (Year: 2000).*

(Continued)

*Primary Examiner* — Yasser A Abdelaziez
(74) *Attorney, Agent, or Firm* — Birch, Stewart, Kolasch & Birch, LLP

(57) ABSTRACT

Discussed is an assembly board including a base portion; a plurality of assembly electrodes extending in one direction and disposed on the base portion at predetermined intervals; a dielectric layer stacked on the base portion to cover the plurality of assembly electrodes; barrier ribs stacked on the dielectric layer and defining cells in which semiconductor light emitting diodes are seated at the predetermined intervals along an extending direction of the plurality of assembly electrodes so as to overlap a portion of the plurality of assembly electrodes; and a voltage applying unit connected to at least opposite ends of the plurality of assembly electrodes to apply one or more voltage signals to the plurality of assembly electrodes, wherein a voltage signal of the same (Continued)

polarity is applied to the plurality of assembly electrodes from the voltage applying unit connected to the opposite ends.

20 Claims, 30 Drawing Sheets

(51) Int. Cl.
  *H01L 33/00* (2010.01)
  *H01L 33/38* (2010.01)
(52) U.S. Cl.
  CPC ............. *H01L 2933/0016* (2013.01); *H01L 2933/0066* (2013.01)
(58) Field of Classification Search
  CPC ......... H01L 2933/0066; H01L 33/0095; H01L 2221/68354; H01L 2221/68368; H01L 21/6835; H01L 25/0753; H01L 21/48; H01L 33/36
  See application file for complete search history.

(56) References Cited

U.S. PATENT DOCUMENTS

| | | |
|---|---|---|
| 2002/0005294 A1 | 1/2002 | Mayer et al. |
| 2008/0251381 A1 | 10/2008 | Shibata et al. |
| 2013/0027623 A1* | 1/2013 | Negishi ............... H01L 25/0753 438/30 |
| 2017/0236811 A1* | 8/2017 | Pokhriyal ............. H01L 33/005 257/91 |
| 2018/0019369 A1 | 1/2018 | Cho et al. |
| 2018/0102352 A1 | 4/2018 | Sasaki et al. |
| 2018/0277524 A1 | 9/2018 | Moon et al. |
| 2019/0027639 A1* | 1/2019 | Yoon ................... H01L 21/6835 |
| 2019/0115513 A1 | 4/2019 | Im et al. |
| 2020/0235076 A1* | 7/2020 | Batres ................ H01L 21/6835 |

FOREIGN PATENT DOCUMENTS

| | | |
|---|---|---|
| KR | 10-1793542 B1 | 11/2017 |
| KR | 10-2513267 B1 | 3/2023 |
| KR | 10-2608419 B1 | 12/2023 |

OTHER PUBLICATIONS

Park et al. ("Horizontally assembled green InGaN nanorod LEDs: scalable polarized surface emitting LEDs using electric-field assisted assembly," Scientific Reports, 6:28312, Jun. 21, 2016) (Year: 2016).*

International Search Report (PCT/ISA/210) issued in PCT/KR2019/008443, dated Mar. 26, 2020.

* cited by examiner

[FIG. 1]
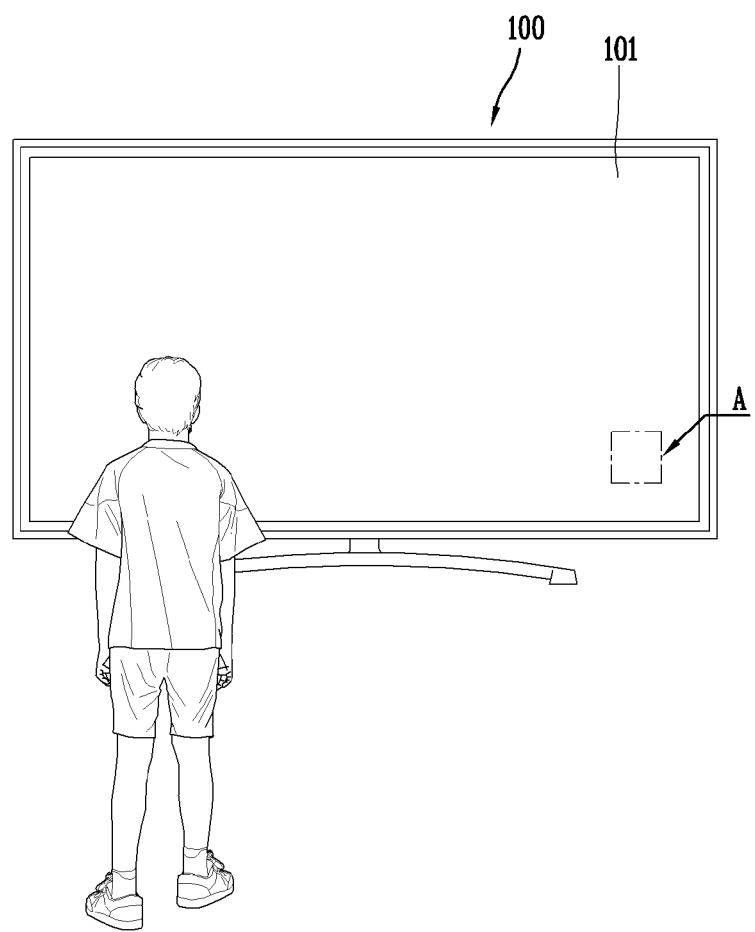

[FIG. 2]
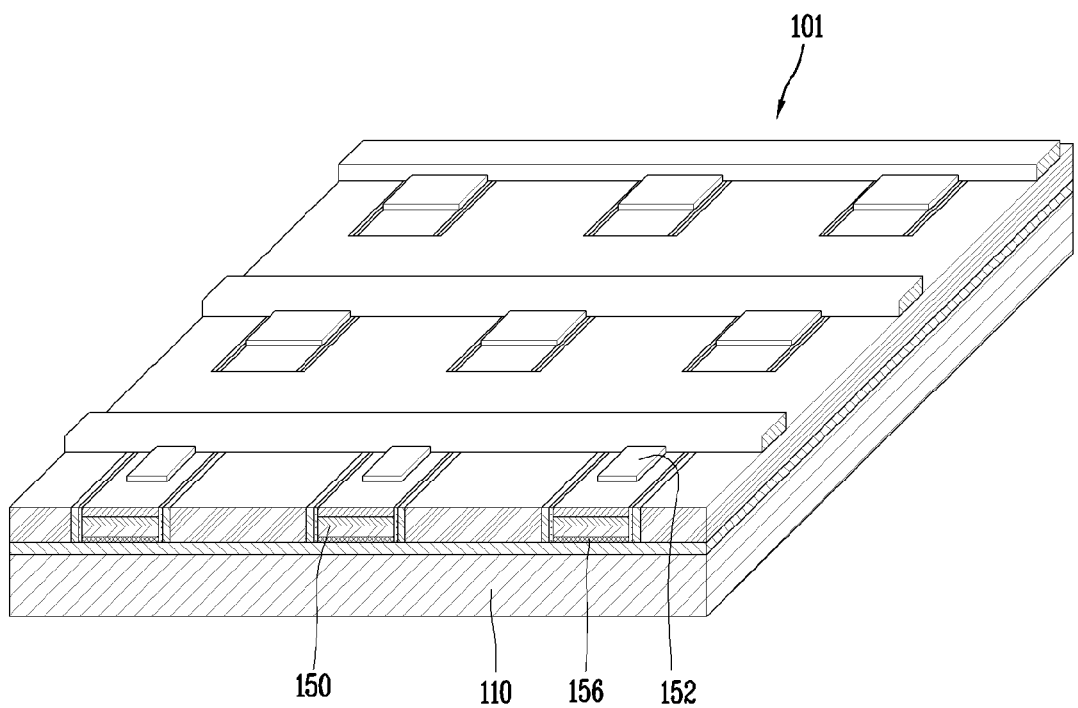

【FIG. 3】
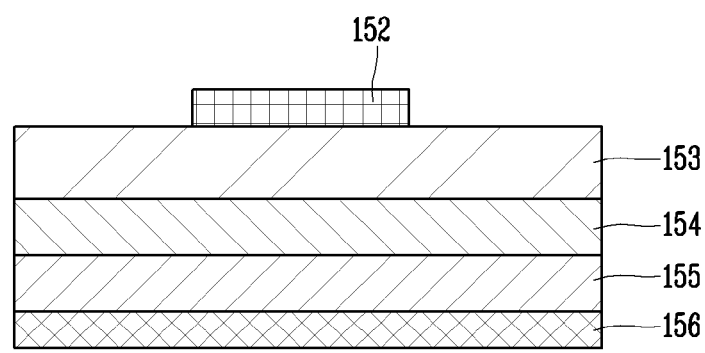

[FIG. 4]
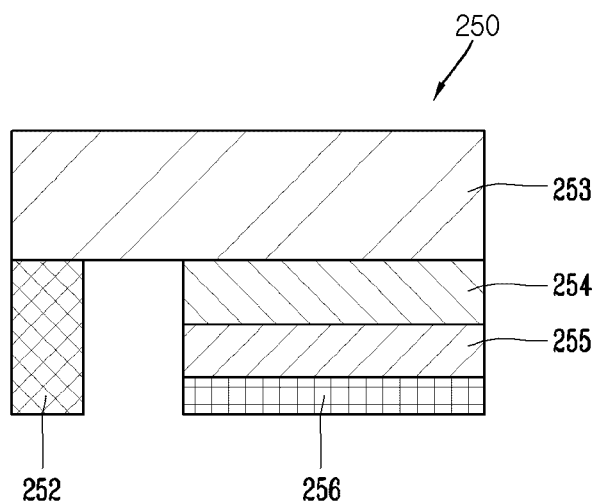

[FIG. 5a]
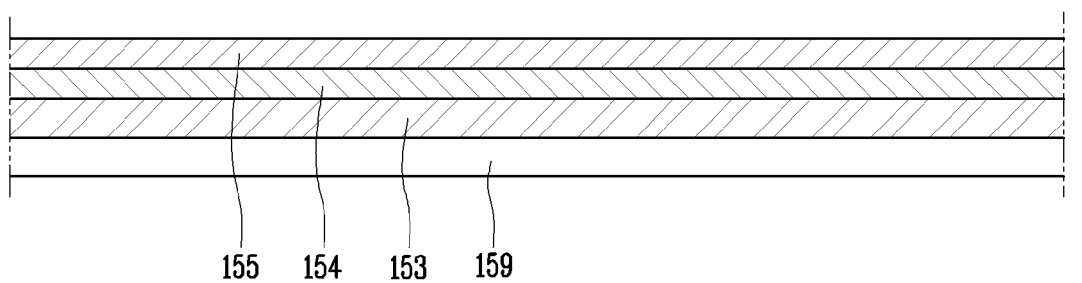

【FIG. 5b】
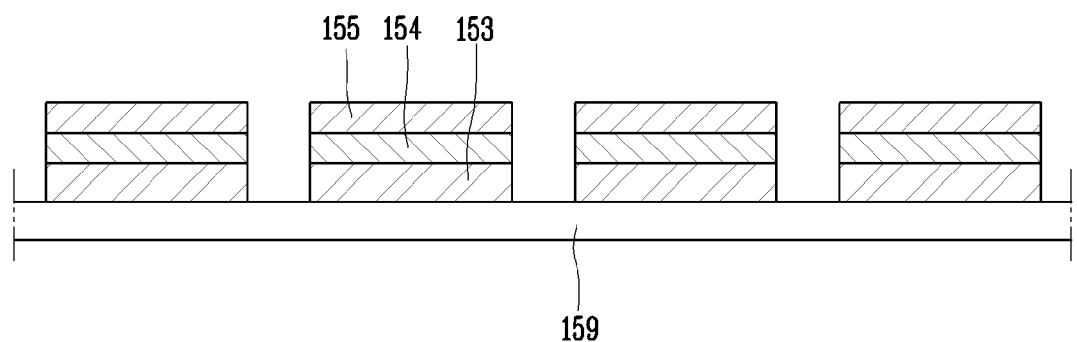

[FIG. 5c]
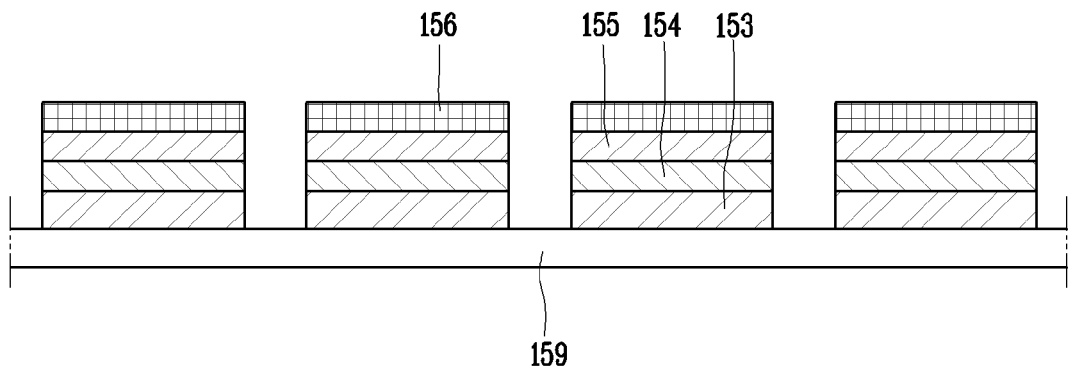

【FIG. 5d】
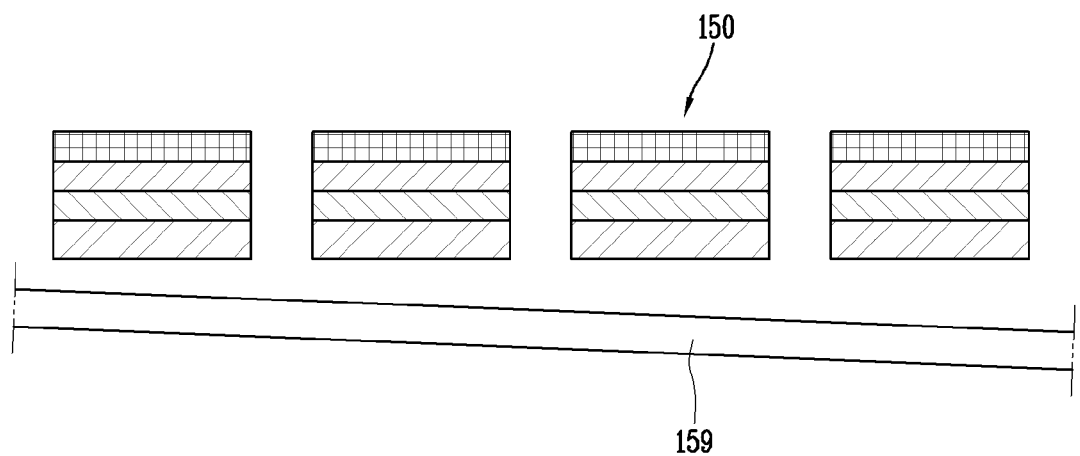

[FIG. 5e]
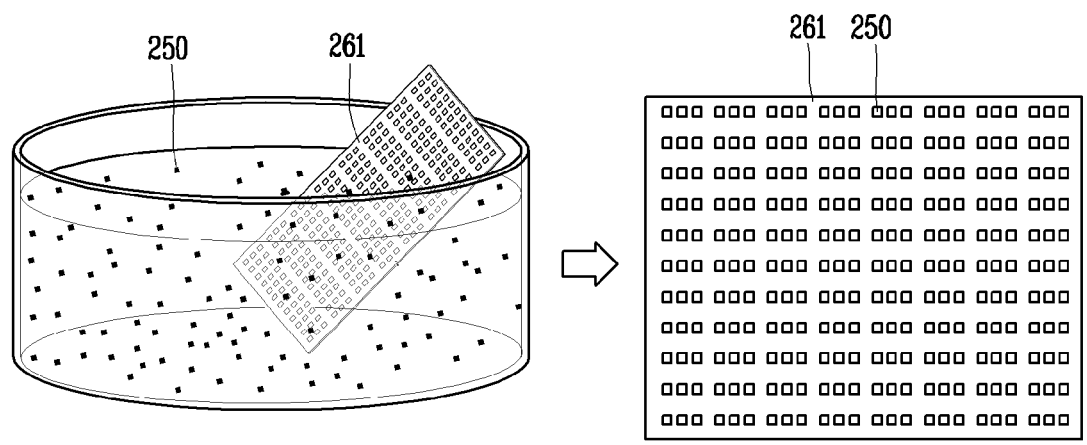

[FIG. 6]
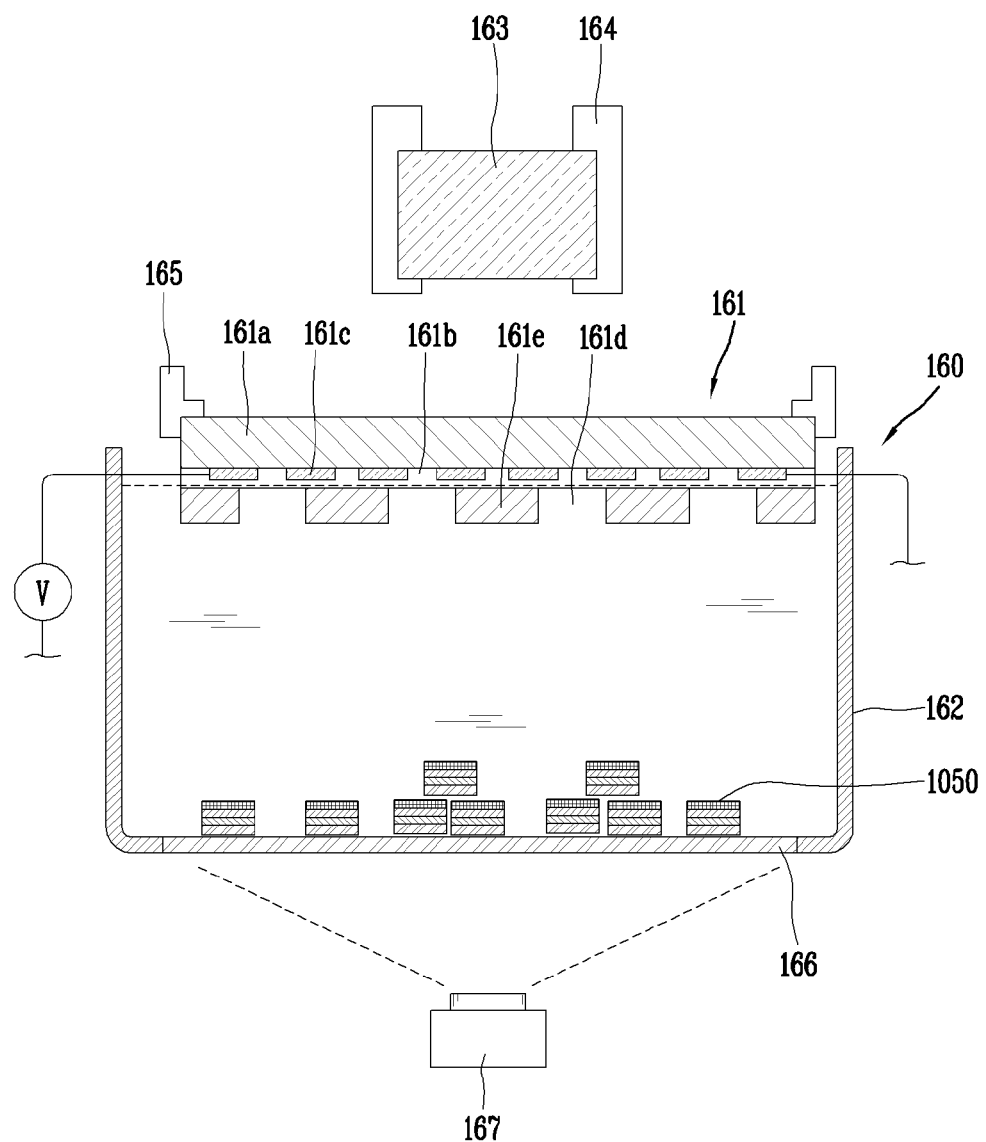

[FIG. 7]
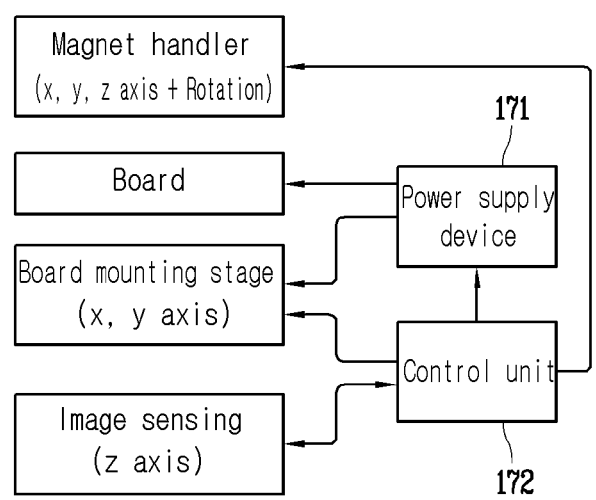

[FIG. 8a]
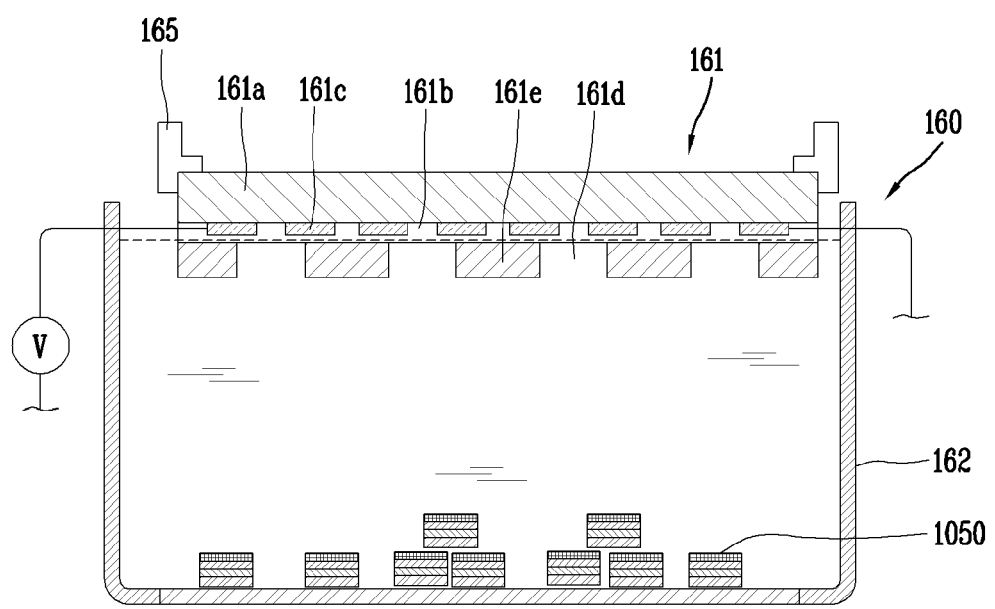

[FIG. 8b]
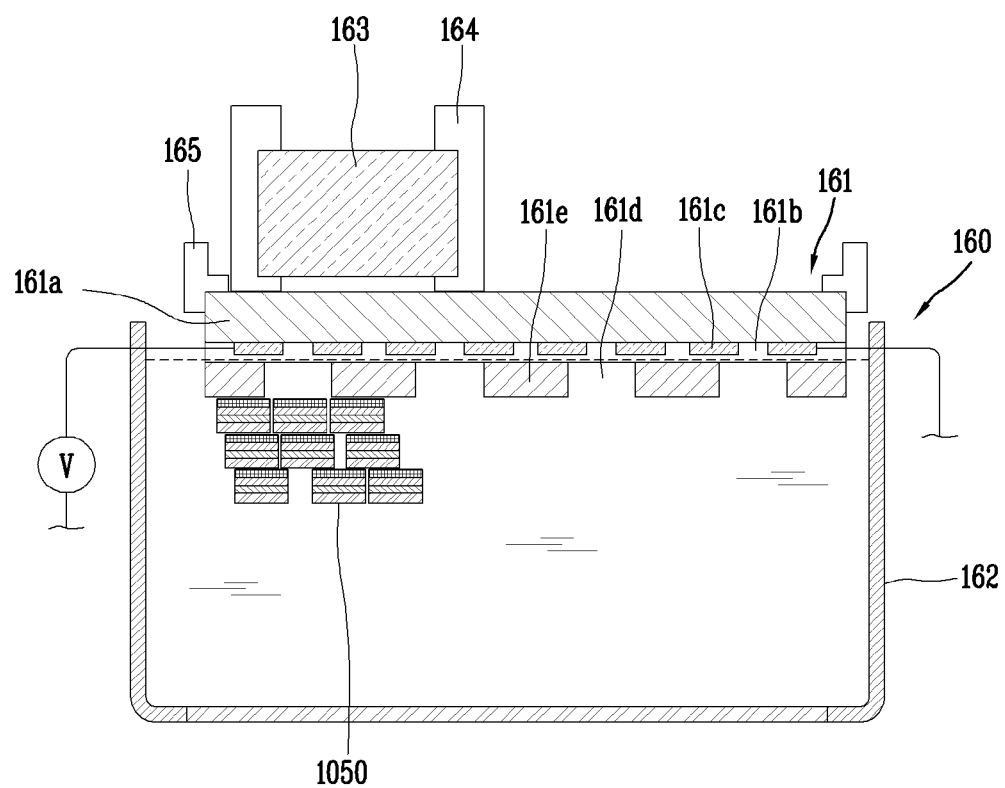

[FIG. 8c]
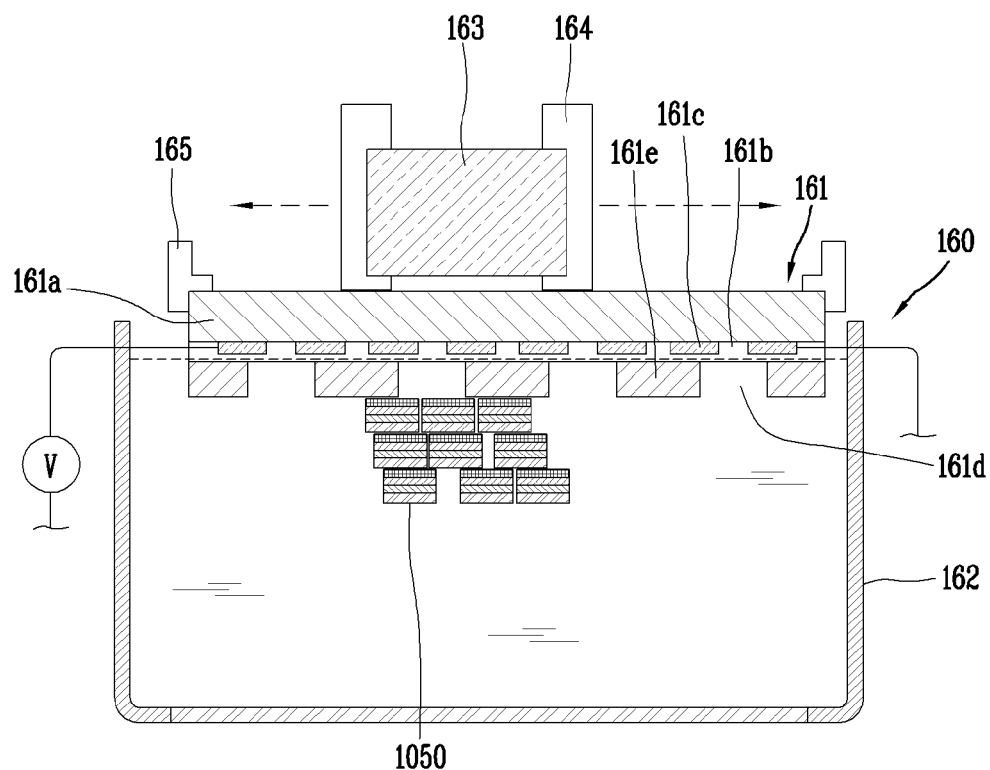

[FIG. 8d]
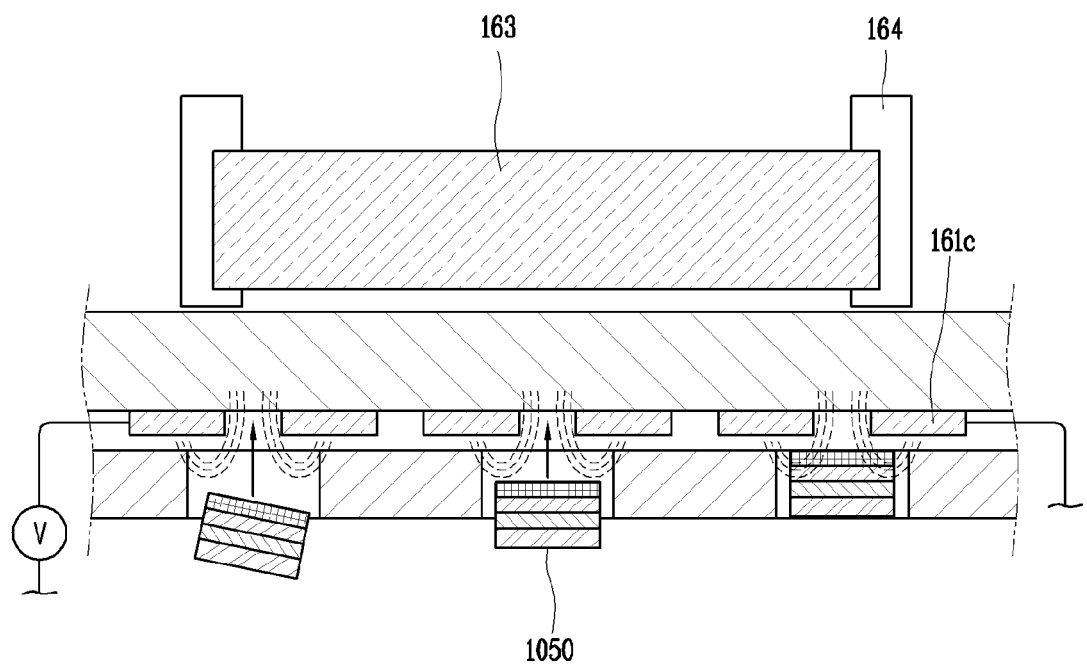

【FIG. 8e】
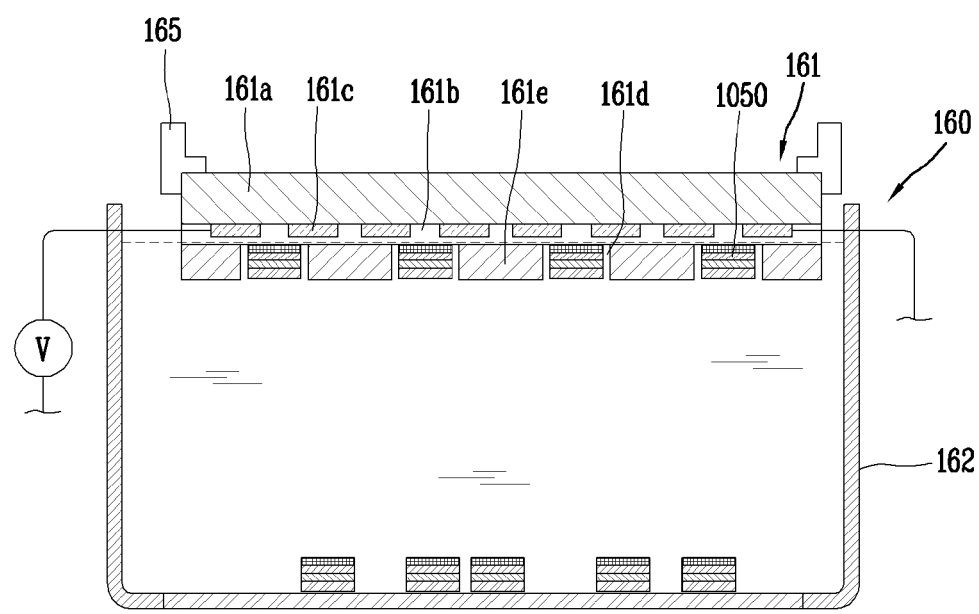

[FIG. 9]
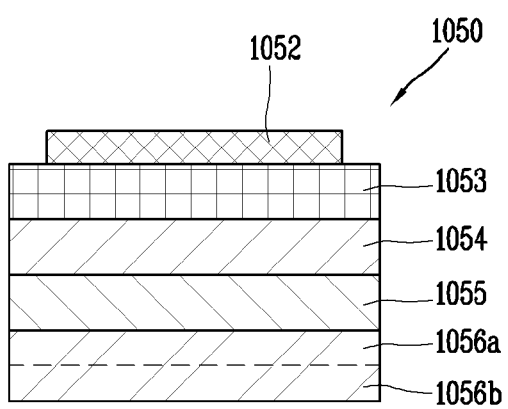

[FIG. 10a]
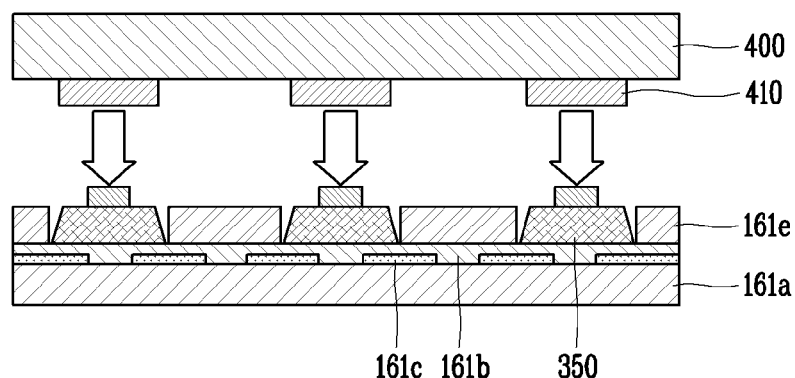

[FIG. 10b]
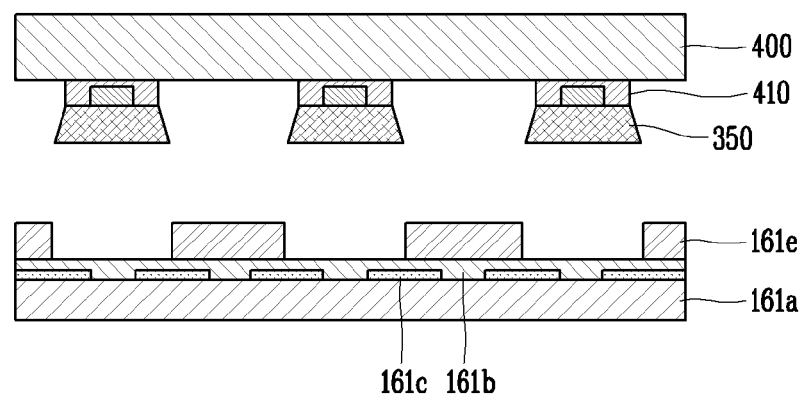

【FIG. 10c】
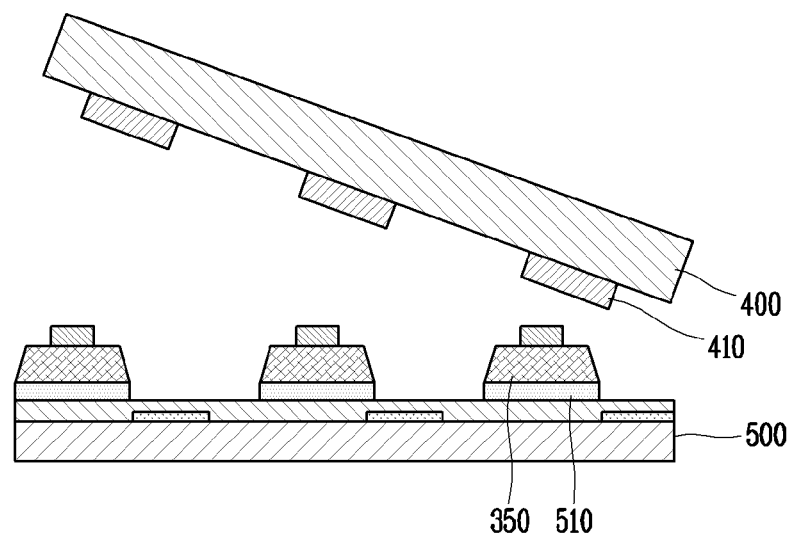

[FIG. 11]
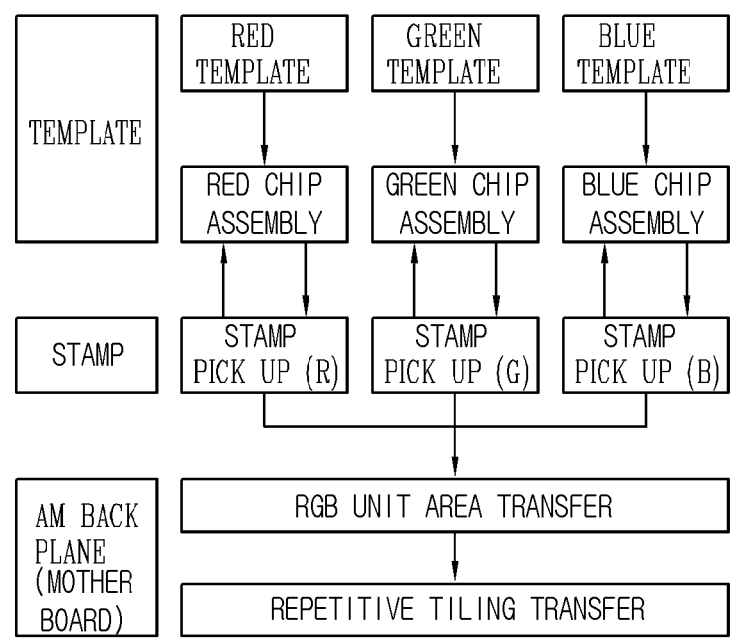

[FIG. 12]
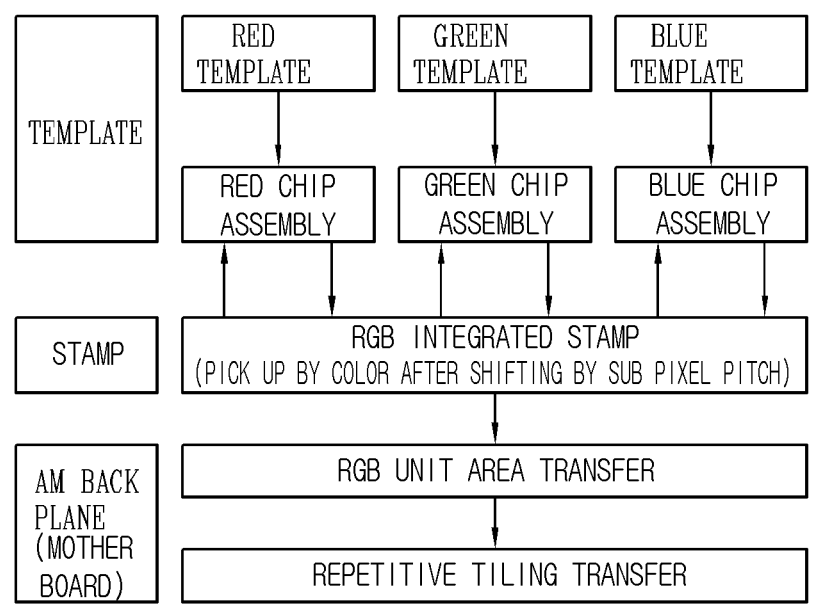

[FIG. 13]
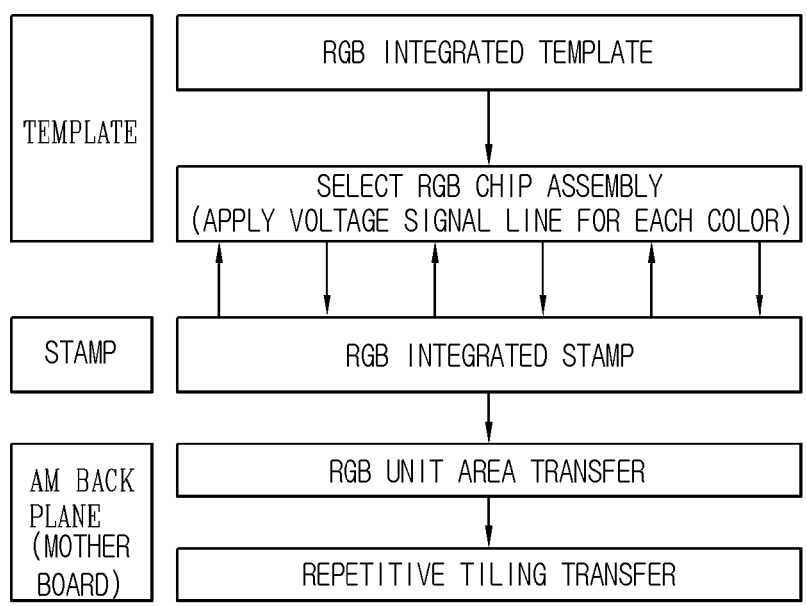

【FIG. 14】
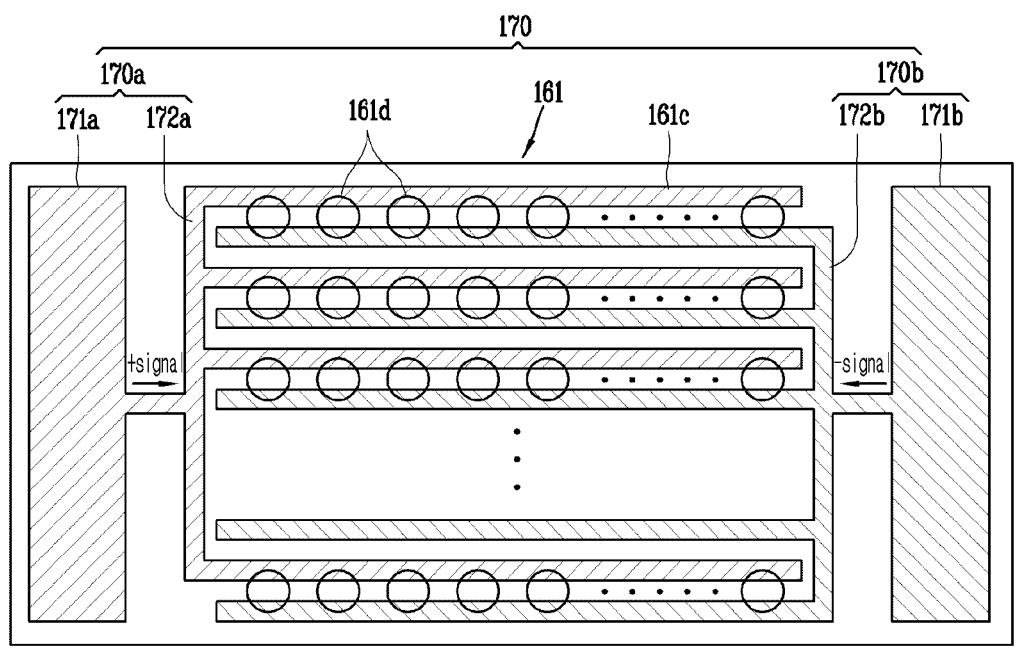

[FIG. 15]
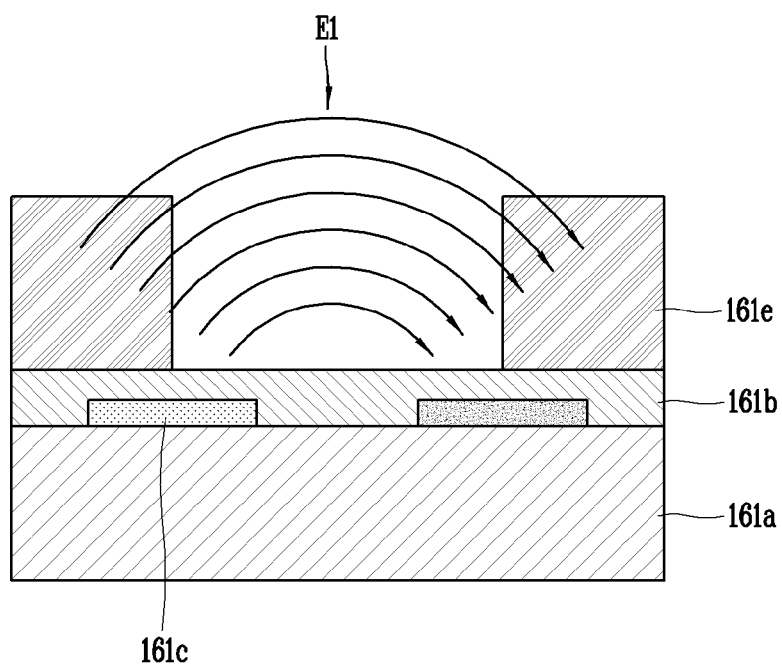

【FIG. 16】
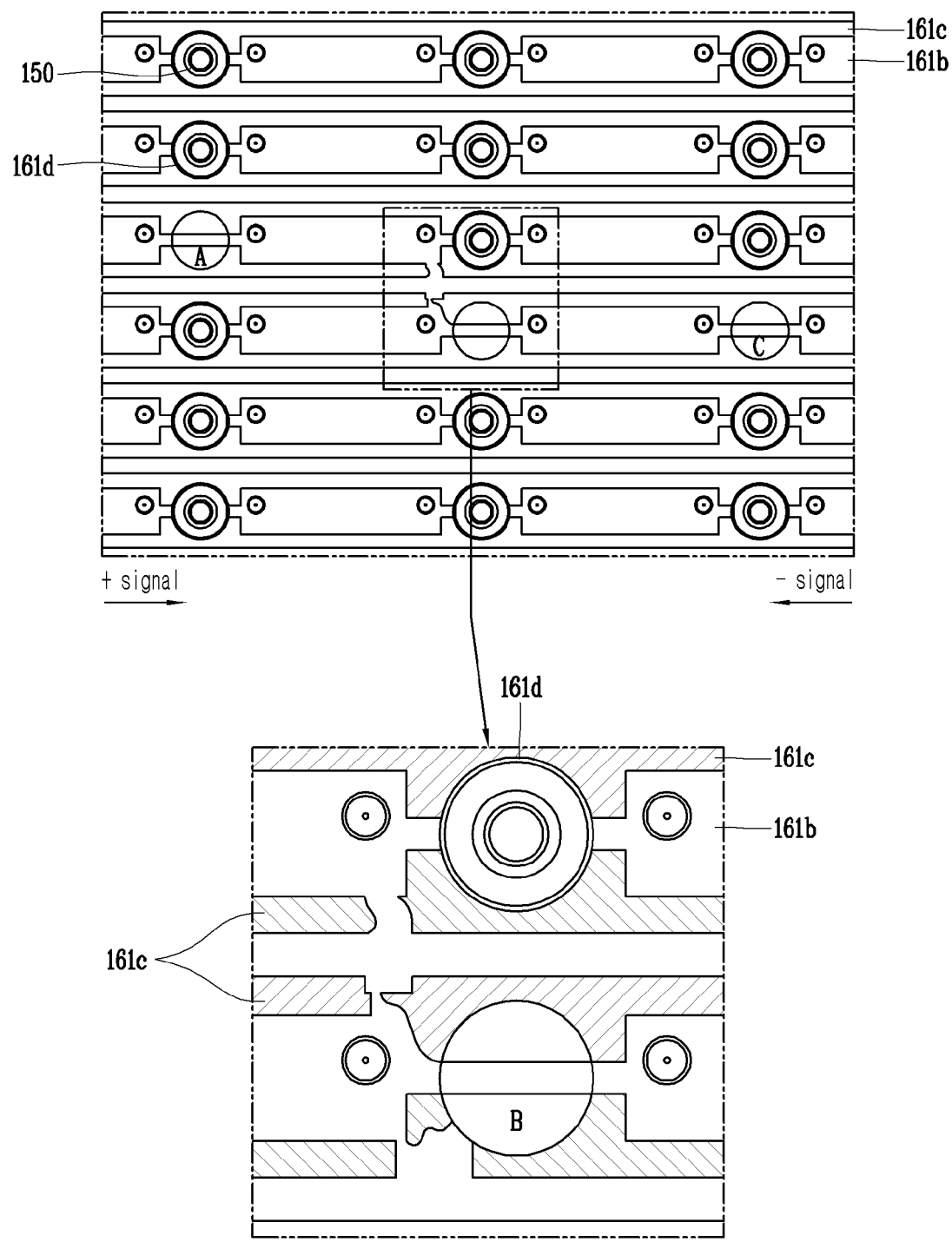

[FIG. 17]
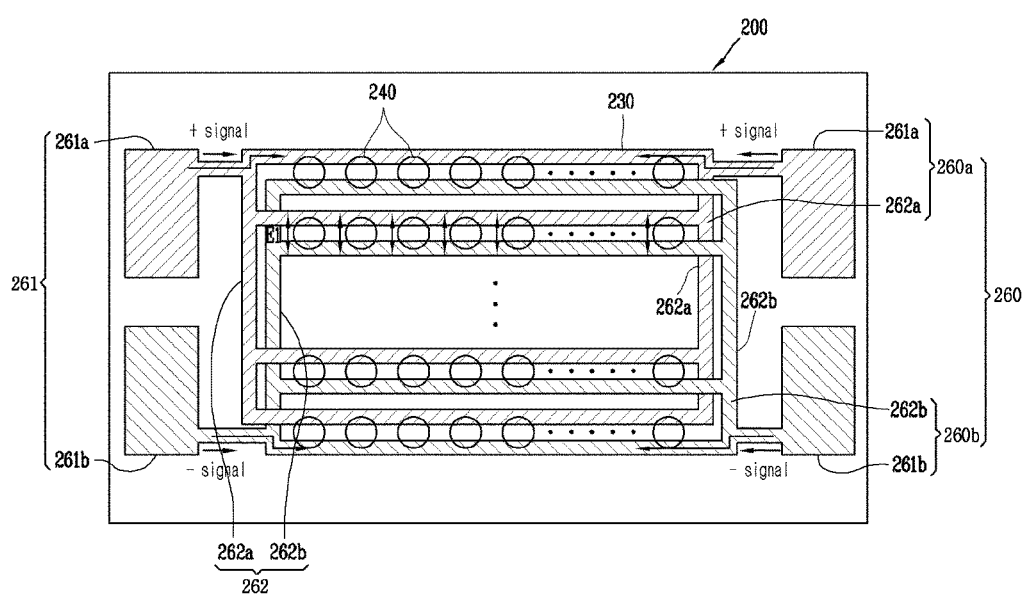

[FIG. 18]
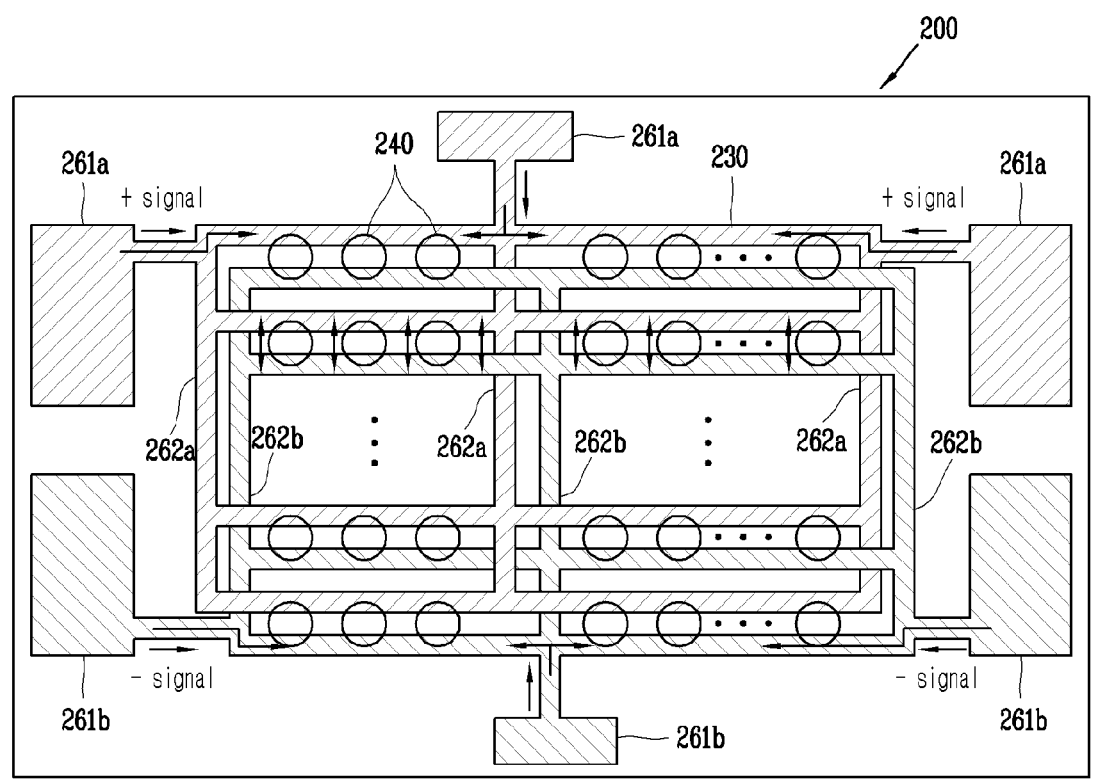

[FIG. 19]
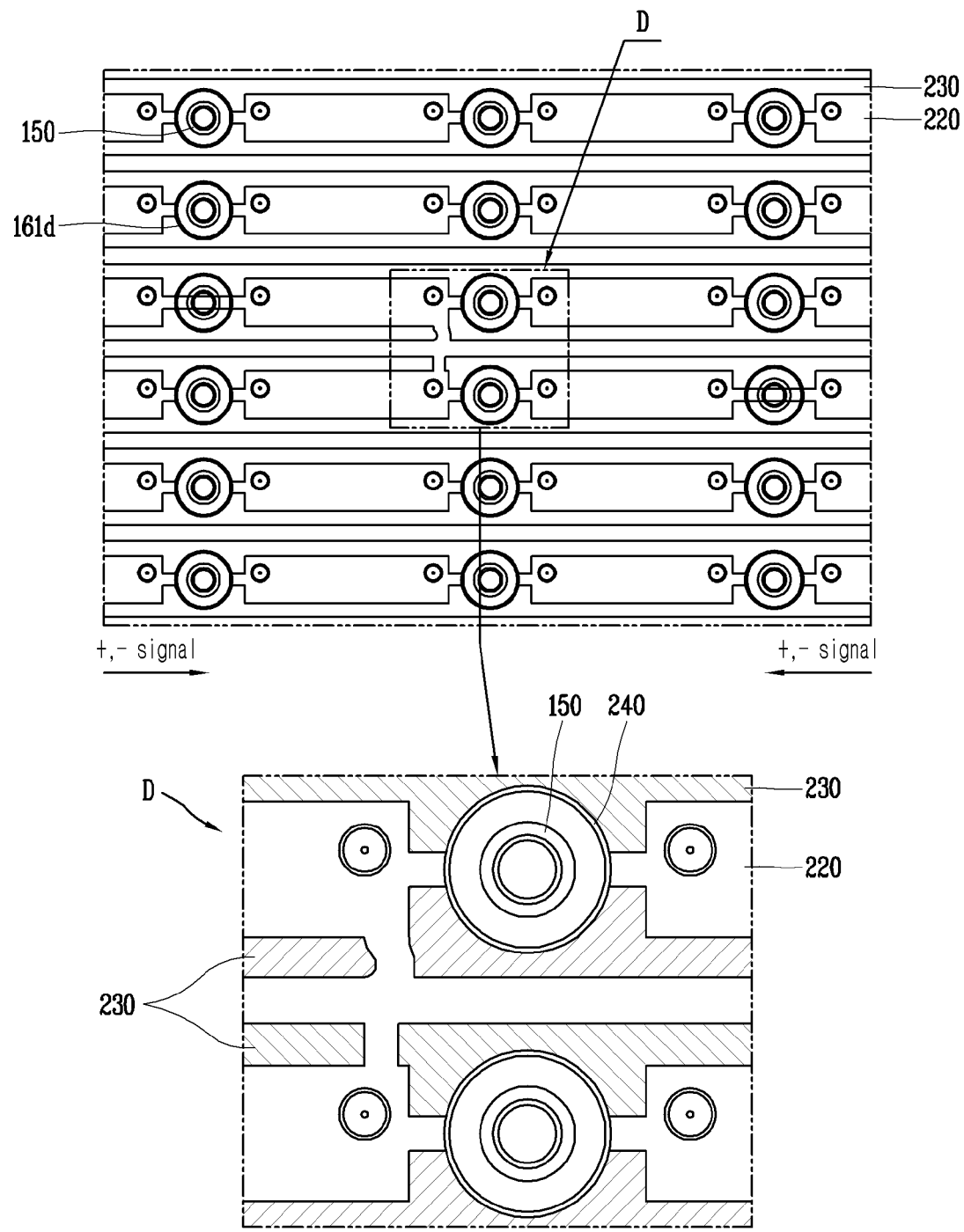

[FIG. 20]
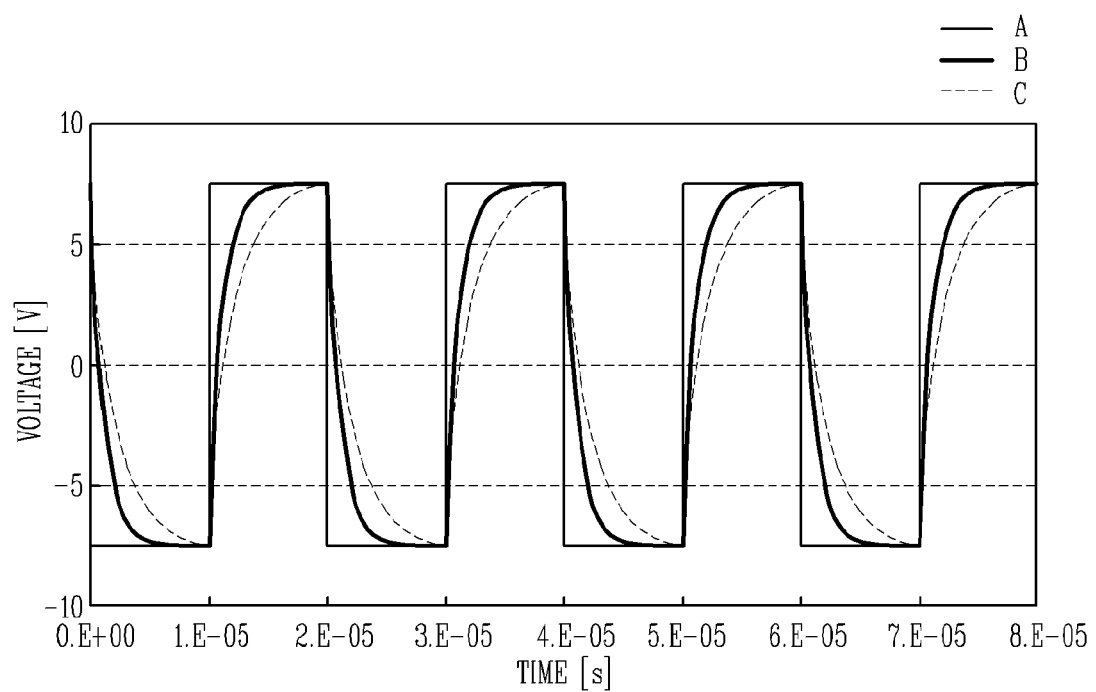

SUBSTRATE FOR MANUFACTURING DISPLAY DEVICE AND METHOD FOR MANUFACTURING DISPLAY DEVICE

CROSS REFERENCE TO RELATED APPLICATIONS

This application is the National Stage filing under 35 U.S.C. 371 of International Application No. PCT/KR2019/008443, filed on Jul. 9, 2019, which claims the benefit of earlier filing date and right of priority to Korean Application No. 10-2019-0078216, filed on Jun. 28, 2019, the contents of all these applications are hereby incorporated by reference herein in their entirety.

TECHNICAL FIELD

The present disclosure relates to an assembly board used in a method for manufacturing a display device and a method for manufacturing a display device using a semiconductor light emitting diode having a size of several to several tens of µm.

BACKGROUND ART

Recently, liquid crystal displays (LCD), organic light emitting diode (OLED) displays, and micro LED displays are competing to implement large-screen displays in the field of display technology.

However, LCDs have problems that response time is not fast and efficiency of light generated by backlight is low, and OLEDs have problems that the lifespan is short, the mass production yield is not good, and the efficiency is low.

On the other hand, when a semiconductor light emitting diode (micro LED) having a diameter or cross-sectional area of 100 µm or less is used for a display, very high efficiency may be achieved because the display does not absorb light using a polarizing plate or the like. However, since a large-screen display requires millions of semiconductor light emitting diodes, it is difficult to transfer the diodes compared to other technologies.

Techniques currently being developed as a transfer process include pick & place technology, laser lift-off (LLO) technology, or self-assembly technology. Among them, the self-assembly technology is a method in which the semiconductor light emitting diodes find its own position in a fluid, and is the most advantageous method for realizing a large-screen display device.

On the other hand, the self-assembly technology includes a method of directly assembling semiconductor light emitting diodes to the final board (or wiring board) on which wirings are formed, and a method of assembling semiconductor light emitting diodes on the assembly board and transferring the semiconductor light emitting diodes to the final board through an additional transfer process. The method of directly assembling the semiconductor light emitting diodes to the final board is efficient in terms of process, and the method of using the assembly board is an advantage in that structures for self-assembly can be added without limitation, so the two methods are selectively used.

DISCLOSURE

Technical Problem

The present disclosure provides an assembly board and a method of manufacturing a display device capable of improving an assembly rate of the semiconductor light emitting diode in a self-assembly method for mounting a semiconductor light emitting diode on an assembly board using an electric field and a magnetic field.

Technical Solution

According to an embodiment of the present disclosure, an assembly board for use in a display manufacturing method for allowing semiconductor light emitting diodes to be seated at preset positions on the assembly board using an electric field and a magnetic field, includes a base portion, a plurality of assembly electrodes extending in one direction and disposed on the base portion at predetermined intervals, a dielectric layer stacked on the base portion to cover the assembly electrodes, barrier ribs stacked on the dielectric layer while forming cells in which semiconductor light emitting diodes are seated at the predetermined intervals along an extending direction of the assembly electrodes so as to overlap a portion of the assembly electrode, and a voltage applying unit connected to at least both ends of the assembly electrodes to apply a voltage signal to the assembly electrodes, wherein voltage signals of the same polarity are applied to the assembly electrodes from the voltage applying unit connected to the both ends.

According to an embodiment, the voltage applying unit includes an electrode pad to which power is applied from outside; and a bus line connected to the electrode pad and the assembly electrodes to supply a voltage signal to the connected assembly electrodes when power is applied to the electrode pad.

According to an embodiment, the voltage applying unit includes a first voltage applying unit including a positive electrode pad and a second voltage applying unit including a negative electrode pad, wherein the assembly board includes the same number of first voltage applying units and second voltage applying units.

According to an embodiment, one of adjacent assembly electrodes is connected to the first voltage applying unit and the other of the adjacent assembly electrodes is connected to the second voltage applying unit such that voltage signals of different polarities are supplied to the adjacent assembly electrodes of the plurality of assembly electrodes.

According to an embodiment, the voltage applying unit is connected to the plurality of assembly electrodes that receive voltage signals of the same polarity.

According to an embodiment, the plurality of assembly electrodes are further connected to a voltage applying unit that applies a voltage signal having the same polarity as that of the voltage applying unit connected to the both ends at an arbitrary position in an extending direction of the assembly electrode.

According to an embodiment, the plurality of assembly electrodes are divided into a plurality of regions having the same length based on the arbitrary position.

According to an embodiment, a method for manufacturing a display device includes transferring an assembly board to an assembly position and putting a plurality of semiconductor light emitting diodes including a magnetic material into a fluid chamber, applying a magnetic force to the semiconductor light emitting diodes put into the fluid chamber to move in one direction, inducing the semiconductor light emitting diodes to move to preset positions by applying an electric field so as to be seated at the preset positions on the assembly board while the semiconductor light emitting diodes are moving, and transferring the semiconductor light emitting diodes seated on the assembly board to a final board on which wirings are formed, wherein a plurality of assembly electrodes for forming an electric field are arranged on the assembly board at predetermined intervals, and a voltage signal of a same polarity is applied to the plurality of assembly electrodes at least at both ends thereof.

According to an embodiment, voltage signals of different polarities are supplied to adjacent assembly electrodes among the plurality of assembly electrodes to form the electric field in a region between the adjacent assembly electrodes.

According to an embodiment, preset positions at which the semiconductor light emitting diodes are seated overlap a region between the adjacent assembly electrodes where an electric field is formed.

Advantageous Effects

According to an embodiment of the present invention, since voltage is supplied from both ends of the assembly electrodes disposed on the assembly substrate, an electric field may be formed by the voltage supplied from the other direction even if the voltage is not supplied in a specific direction due to a defect in the assembly electrode, it is possible to improve the assembly rate of the semiconductor light emitting diode, and accordingly, there is an effect of shortening the repair process time performed after self-assembly.

In addition, since voltage signals are supplied from multiple directions to one assembly electrode, a signal transmission path is shortened, and thus, resistance due to the length of the assembly electrode can be reduced.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5a to 5e are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8a to 8e are conceptual views illustrating a process of self-assembling a semiconductor light emitting diode using the self-assembly apparatus of FIG. 6.

FIG. 9 is a conceptual diagram for describing the semiconductor light emitting diode of FIGS. 8a to 8e.

FIGS. 10a to 10c are conceptual views illustrating a state in which a semiconductor light emitting diode is transferred after a self-assembly process according to the present disclosure.

FIGS. 11 to 13 are flowcharts illustrating a method of manufacturing a display device including semiconductor light emitting diodes that emit red (R) light, green (G) light, and blue (B) light.

FIG. 14 is a view showing the structure of a conventional assembly substrate.

FIG. 15 is a conceptual diagram illustrating a form of an electric field formed between assembly electrodes.

FIG. 16 is a view showing an assembly state when an electrode defect occurs in a conventional assembly board.

FIG. 17 is a view showing a structure of an assembly board according to an embodiment of the present disclosure.

FIG. 18 is a view showing a structure of an assembly board according to another embodiment of the present disclosure.

FIG. 19 is a view showing an assembly state when an electrode defect occurs in an assembly board according to an embodiment of the present disclosure.

FIG. 20 is a graph showing a simulation analysis result for a voltage applied to a cell formed on an assembly board according to the related art and an embodiment of the present disclosure.

MODE FOR INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, the configuration according to the embodiment described in this specification may be applied as long as it can include a display even in a new product form to be developed later.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a control unit of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in a upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductivity type semiconductor layer 153, an active layer 154, and a second conductivity type semiconductor layer 155 are individually grown on a growth substrate 159 (FIG. 5a).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth board 1059 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Next, at least a portion of the first conductivity type semiconductor layer 153, the active layer 154, and the second conductivity type semiconductor layer 155 are removed to form a plurality of semiconductor light emitting diodes (FIG. 5B).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Next, second conductivity type electrodes 156 (or p-type electrodes) are formed on one surface of the second conductivity type semiconductor layer 155 (FIG. 5C). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting diodes. For example, the growth board 1059 may be removed using a laser lift-off (LLO) method or a chemical lift-off (CLO) method (FIG. 5D).

Thereafter, the semiconductor light emitting diodes 150 are seated on a board in a chamber filled with a fluid (FIG. 5E).

For example, the semiconductor light emitting diodes 150 and the board are put in the chamber filled with a fluid, and the semiconductor light emitting diodes are self-assembled onto the board 1061 using flow, gravity, surface tension, and the like. In this case, the board may be an assembly board 161.

As another example, it is also possible to put the wiring board in a fluid chamber instead of the assembly board 161 so that the semiconductor light emitting diodes 150 are directly seated on the wiring board. In this case, the board may be the wiring board. However, for convenience of description, in the present disclosure, the substrate is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary substrate.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8a to 8d are conceptual views illustrating a process of self-assembling a semiconductor light emitting diode using the self-assembly apparatus of FIG. 6, and FIG. 9 is a conceptual diagram for describing the semiconductor light emitting diode of FIGS. 8a to 8d.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The substrate 161 may be disposed in the fluid chamber 162 such that an assembly surface on which the semiconductor light emitting diodes 150 are assembled faces downward. For example, the substrate 161 may be transferred to an assembly position by a transfer device, and the transfer device may include a stage 165 on which the substrate is mounted. The position of the stage 165 is controlled by the control unit, and through this, the substrate 161 may be transferred to the assembly position.

In this case, in the assembly position, the assembly surface of the substrate 161 faces the bottom of the fluid chamber 150. As shown, the assembly surface of the substrate 161 is disposed to be immersed in the fluid in the fluid chamber 162. Accordingly, the semiconductor light emitting diode 150 moves to the assembly surface in the fluid.

The substrate 161 is an assembly board in which an electric field is able to be formed, and may include a base portion 161*a*, a dielectric layer 161*b*, and a plurality of electrodes 161*c*.

The base portion 161*a* may be formed of an insulating material, and the plurality of electrodes 161*c* may be a thin or thick bi-planar electrode patterned on one surface of the base portion 161*a*. The electrode 161*c* may be formed of, for example, a stack of Ti/Cu/Ti, Ag paste, and ITO.

The dielectric layer 161*b* may be formed of an inorganic material such as $SiO_2$, $SiN_x$, SiON, $Al_2O_3$, $TiO_2$, $HfO_2$, or the like. Alternatively, the dielectric layer 161*b* may be comprised of a single layer or a multi-layer as an organic insulator. The dielectric layer 161*b* may have a thickness of several tens of nm to several μm.

Furthermore, the substrate 161 according to the present disclosure includes a plurality of cells 161*d* separated by barrier ribs. The cells 161*d* are sequentially arranged in one direction and may be made of a polymer material. Also, the barrier ribs 161*e* defining the cells 161*d* are shared with the neighboring cells 161*d*. The barrier ribs 161*e* may protrude from the base portion 161*a*, and the cells 161*d* may be sequentially arranged along one direction by the barrier ribs 161*e*. More specifically, the cells 161*d* are sequentially arranged in the column and row directions, respectively, and may have a matrix structure.

As shown, the cell 161*d* may have a groove for accommodating the semiconductor light emitting diode 150 and the groove may be a space defined by the barrier ribs 161*e*. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161*c* may include a plurality of electrode lines disposed at the bottom of each of the cells 161*d*, and the plurality of electrode lines may extend to adjacent cells.

The plurality of electrodes 161*c* are disposed below the cells 161*d*, and different polarities are applied to the electrodes 161*c* to generate an electric field in the cells 161*d*. To form the electric field, the dielectric layer may form the bottom of the cells 161*d* while the dielectric layer is covering the plurality of electrodes 161*c*. In this structure, when different polarities are applied to the pair of electrodes 161*c* under the cells 161*d*, an electric field is formed, and the semiconductor light emitting diodes may be inserted into the cells 161*d* due to the electric field.

In the assembly position, the electrodes of the substrate 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the substrate 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056*a* and a second layer 1056*b*. Here, the first layer 1056*a* may include a magnetic material, and the second layer 1056*b* may include a metal material rather than a magnetic material.

As shown, in this example, the first layer 1056*a* including a magnetic material may be disposed to contact the second conductivity type semiconductor layer 1055. In this case, the first layer 1056*a* is disposed between the second layer 1056*b* and the second conductivity type semiconductor layer 1055. The second layer 1056*b* may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the substrate 161, clockwise or counterclockwise direction.

Meanwhile, a bottom plate 166 having a light-transmitting property may be formed in the fluid chamber 162, and the semiconductor light emitting diodes may be disposed between the bottom plate 166 and the substrate 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the substrate 161.

The self-assembly apparatus described above is configured to use a combination of a magnetic field and an electric field, and when using this, the semiconductor light emitting diodes may be seated at predetermined positions on the substrate due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5a to 5c. In this case, in the process of forming the second conductivity type electrode of FIG. 5c, a magnetic material may be deposited on the semiconductor light emitting diode.

Next, the substrate 161 is transferred to an assembly position, and the semiconductor light emitting diodes 1050 are put into the fluid chamber 162 (FIG. 8a).

As described above, the assembly position of the substrate 161 may be a position in which the substrate 161 is to be disposed in the fluid chamber 162 such that the assembly surface of the substrate 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8B).

When the magnet 163 of the self-assembly apparatus moves from its original position to the opposite surface of the assembly surface of the substrate 161, the semiconductor light emitting diodes 1050 may float toward the substrate 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the substrate 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the substrate.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the substrate, clockwise or counterclockwise (FIG. 8c). In this case, the semiconductor light emitting diodes 1050 move in a direction parallel to the substrate 161 from positions spaced apart from the substrate 161 due to the magnetic force.

Next, an electric field is applied to guide the semiconductor light emitting diodes 1050 to preset positions such that the semiconductor light emitting diodes 1050 are seated in the preset positions of the substrate 161 while the semiconductor light emitting diodes 1050 are moving (FIG. 8c). For example, while the semiconductor light emitting diodes 1050 are moving in a direction horizontal to the substrate 161, the semiconductor light emitting diodes 1050 may move in a direction perpendicular to the substrate 161 due to the electric field, and be then seated in the preset positions of the substrate 161.

More specifically, an electric field is generated by supplying power to the bi-planar electrode of the substrate 161 to enable assembly to be made only at preset positions. That is, the semiconductor light emitting diodes 1050 are self-assembled at assembly positions of the substrate 161 by using the selectively generated electric field. To this end, cells in which the semiconductor light emitting diodes 1050 are inserted may be provided in the substrate 161.

Thereafter, a process of unloading the substrate 161 is performed, and the assembly process is finished. When the substrate 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the substrate 161 such that the semiconductor light emitting diodes 1050 remaining in the fluid chamber 162 fall to the bottom of the fluid chamber 162 (FIG. 8d). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

On the other hand, the present disclosure provides a structure and method for an assembly board for increasing the yield of the above-described self-assembly process and the process yield after self-assembly. The present disclosure is limited to a case where the substrate 161 is used as an assembly board. That is, the assembly board, which will be described later, is not used as a wiring board of the display device. Accordingly, the substrate 161 will be referred to as an assembly board 161 hereinafter.

The present disclosure improves the process yield in two respects. First, according to the present disclosure, it is possible to prevent an electric field from occurring strongly at an unwanted position, and the semiconductor light emitting diode from being seated at an unwanted position. Second, according to the present disclosure, it is possible to prevent a semiconductor light emitting diode from remaining on the assembly board when semiconductor light emitting diodes seated on the assembly board are transferred to another substrate.

The above-described objects are not individually achieved by different components. The two objects described above may be achieved by organically combining the components to be described later and the assembly board 161 described above.

Before describing the present disclosure in detail, a post-process for manufacturing a display device after self-assembly will be described.

FIGS. 10a to 10c are conceptual views illustrating a state in which a semiconductor light emitting diode is transferred after a self-assembly process according to the present disclosure.

When the self-assembly process described with reference to FIGS. 8a to 8e is finished, the semiconductor light emitting diodes have been seated at preset positions of the assembly board 161. The semiconductor light emitting diodes seated on the assembly board 161 are transferred to another substrate at least once. Although the semiconductor light emitting diodes mounted on the assembly board 161 are described as being transferred twice in the present specification, the present disclosure is not limited thereto, and the semiconductor light emitting diodes mounted on the assembly board 161 may be transferred to another substrate once or three times.

On the other hand, immediately after the self-assembly process is finished, the assembly surface of the assembly board 161 is facing downward (or in the direction of gravity). For processes after the self-assembly process, the assembly board 161 may be turned 180 degrees in a state in which the semiconductor light emitting diode are seated thereon. In this process, since there is a risk that the semiconductor light emitting diode is separated from the assembly board 161, a voltage may be applied to a plurality of electrodes 161c (hereinafter, assembly electrodes) while the assembly board 161 is being turned over. An electric field formed between the assembly electrodes may prevent the semiconductor light emitting diodes from being separated from the assembly board 161 while the assembly board 161 is being turned over.

When the assembly board 161 is turned over 180 degrees after the self-assembly process, the state is as shown in FIG. 10a. Specifically, as shown in FIG. 10a, the assembly surface of the assembly board 161 is facing upward (or in a direction opposite to gravity). In this state, the transfer board 400 is aligned above the assembly board 161.

The transfer board 400 is a substrate for transferring the semiconductor light emitting diodes seated on the assembly board 161 to a wiring board by detaching the semiconductor light emitting diodes. The transfer board 400 may be formed of a polydimethylsiloxane (PDMS) material. Accordingly, the transfer board 400 may be referred to as a PDMS substrate.

The transfer board 400 is pressed to the assembly board 161 after being aligned with the assembly board 161. Thereafter, when the transfer board 400 is transferred to the upper side of the assembly board 161, the semiconductor light emitting diodes 350 disposed on the assembly board 161 are transferred to the transfer board 400 due to the adhesion of the transfer board 400.

To this end, the surface energy between the semiconductor light emitting diodes 350 and the transfer board 400 should be higher than the surface energy between the semiconductor light emitting diodes 350 and the dielectric layer 161b. Since probability that the semiconductor light emitting diodes 350 are separated from the assembly board 161 increases as the difference between the surface energy between the semiconductor light emitting diodes 350 and the transfer board 400 and the surface energy between the semiconductor light emitting diodes 350 and the dielectric layer 161b increases, it is preferable that the difference between the two surface energies is greater.

On the other hand, when the transfer board 400 is pressed against the assembly board 161, the transfer board 400 may include a plurality of protrusions 410 such that the pressure applied by the transfer board 400 is concentrated on the semiconductor light emitting diodes 350. The protrusions 410 may be formed at the same interval as the semiconductor light emitting diodes seated on the assembly board 161. When the projections 410 are aligned to overlap the semiconductor light emitting diodes 350 and then the transfer board 400 is pressed against the assembly board 161, the pressure exerted by the transfer board 400 may be concentrated to only the semiconductor light emitting diodes 350. Through this, the present disclosure increases the probability that the semiconductor light emitting diodes are separated from the assembly board 161.

Meanwhile, it is preferable that a portion of the semiconductor light emitting diode is exposed to the outside of the groove while the semiconductor light emitting diode is seated on the assembly board 161. When the semiconductor light emitting diode 350 is not exposed to the outside of the groove, the pressure by the transfer board 400 is not concentrated on the semiconductor light emitting diode 350, thus reducing probability that the semiconductor light emitting diode 350 is separated from the assembly board 161.

Finally, referring to FIG. 10c, the semiconductor light emitting diodes 350 are transferred from the transfer board 400 to the wiring board 500 by pressing the transfer board 400 against the wiring board 500. In this case, a protrusion 510 may be formed on the wiring board 500. The transfer board 400 and the wiring board 500 are aligned with each other such that the semiconductor light emitting diodes 350 disposed on the transfer board 400 overlap the protrusions 510. Thereafter, when the transfer board 400 and the wiring board 500 are compressed, the probability that the semiconductor light emitting diodes 350 are separated from the transfer board 400 may increase due to the protrusions 510.

Meanwhile, in order for the semiconductor light emitting diodes 350 disposed on the transfer board 400 to be transferred to the wiring board 500, the surface energy between the semiconductor light emitting diodes 350 and the wiring board 500 should be higher than the surface energy between the semiconductor light emitting diodes 350 and the transfer board 400. Since probability that the semiconductor light emitting diodes 350 are separated from the transfer board 400 increases as the difference between the surface energy between the semiconductor light emitting diodes 350 and the wiring board 500 and the surface energy between the semiconductor light emitting diodes 350 and the transfer board 400 increases, it is preferable that the difference between the two surface energies is greater.

After transferring all the semiconductor light emitting diodes 350 disposed on the transfer board 400 to the wiring board 500, electrical connections between the semiconductor light emitting diodes 350 and the wiring electrodes formed on the wiring board may be formed. The structure of the wiring electrode and the method of forming the electrical connection may be changed depending on the type of the semiconductor light emitting diode 350.

Meanwhile, although not shown, an anisotropic conductive film may be disposed on the wiring board 500. In this case, the electrical connections may be formed between the semiconductor light emitting diodes 350 and the wiring electrodes formed on the wiring board 500 only by pressing the transfer board 400 and the wiring board 500.

Meanwhile, in the case of manufacturing a display device including semiconductor light emitting diodes emitting different colors, the method described with reference to FIGS. 10a to 10c may be implemented in various ways. Hereinafter, a method of manufacturing a display device including semiconductor light emitting diodes that emit red (R) light, green (G) light, and blue (B) light will be described.

FIGS. 11 to 13 are flowcharts illustrating a method of manufacturing a display device including semiconductor light emitting diodes that emit red (R) light, green (G) light, and blue (B) light.

The semiconductor light emitting diodes emitting different colors may be individually assembled on different assembly boards. Specifically, the assembly board 161 may include a first assembly board on which semiconductor light emitting diodes emitting a first color are mounted, a second assembly board on which semiconductor light emitting diodes emitting a second color different from the first color are mounted, and a third assembly board on which semiconductor light emitting diodes emitting a third color different from the first and second colors are mounted. Different types of semiconductor light emitting diodes are assembled on the assembly boards according to the method described with reference to FIGS. 8a to 8e. For example, the semiconductor light emitting diodes emitting red (R) light, green (G) light, and blue (B) light may be respectively assembled on the first to third assembly boards.

Referring to FIG. 11, each of a RED chip, a GREEN chip, and a BLUE chip may be respectively assembled on the first to third assembly boards RED TEMPLATE, GREEN TEMPLATE, and BLUE TEMPLATE. In this state, the RED chip, the GREEN chip, and the BLUE chip may be transferred to the wiring board by different transfer boards respectively.

Specifically, transferring the semiconductor light emitting diodes seated on the assembly board to the wiring board may include transferring the semiconductor light emitting diodes (RED chips) emitting the first color from the first assembly board (RED TEMPLATE) to a first transfer board (stamp (R)) by pressing the first transfer board (stamp (R)) against the first assembly board (RED TEMPLATE); transferring the semiconductor light emitting diodes (GREEN chips) emitting the second color from the second assembly board (GREEN TEMPLATE) to a second transfer board (stamp (G)) by pressing the second transfer board (stamp (G)) against the second assembly board (GREEN TEMPLATE); and transferring the semiconductor light emitting diodes (BLUE chips) emitting the third color from the third assembly board (BLUE TEMPLATE) to a third transfer board (stamp (B)) by pressing the third transfer board (stamp (B)) against the third assembly board (BLUE TEMPLATE).

Thereafter, by individually pressing the first to third transfer boards to the wiring board, the semiconductor light emitting diodes emitting light of the first to third colors are transferred from the first to third transfer boards to the wiring board.

According to the manufacturing method of FIG. 11, three types of assembly boards and three types of transfer boards are required to manufacture a display device including a RED chip, a GREEN chip, and a BLUE chip.

On the other hand, referring to FIG. 12, each of a RED chip, a GREEN chip, and a BLUE chip may be respectively assembled on the first to third assembly boards RED TEMPLATE, GREEN TEMPLATE, and BLUE TEMPLATE. In this state, the RED chip, the GREEN chip, and the BLUE chip may be transferred to the wiring board by the same transfer board respectively.

Specifically, transferring the semiconductor light emitting diodes seated on the assembly board to the wiring board may include transferring the semiconductor light emitting diodes (RED chips) emitting the first color from the first assembly board (RED TEMPLATE) to a transfer board (RGB integrated stamp) by pressing the transfer board (RGB integrated stamp) against the first assembly board (RED TEMPLATE); transferring the semiconductor light emitting diodes (GREEN chips) emitting the second color from the second assembly board (GREEN TEMPLATE) to the transfer board (RGB integrated stamp) by pressing the transfer board (RGB integrated stamp) against the second assembly board (GREEN TEMPLATE); and transferring the semiconductor light emitting diodes (BLUE chips) emitting the third color from the third assembly board (BLUE TEMPLATE) to the transfer board (RGB integrated stamp) by pressing the transfer board (RGB integrated stamp) against the third assembly board (BLUE TEMPLATE).

In this case, alignment positions between the first to third assembly boards and the transfer board may be different from each other. For example, when alignment between the assembly board and the transfer board is completed, a relative position of the transfer board with respect to the first assembly board may be different from a relative position of the transfer board with respect to the second assembly board. The alignment position of the transfer board may be shifted by the PITCH of the SUB PIXEL whenever the type of the assembly board is changed. In this way, when the transfer board is sequentially pressed against the first to third assembly boards, all three types of chips may be transferred to the transfer board.

Thereafter, as in FIG. 11, the semiconductor light emitting diodes emitting light of the first to third colors are transferred from the transfer board to the wiring board by pressing the transfer board against the wiring board.

According to the manufacturing method of FIG. 12, three types of assembly boards and one type of transfer board are required to manufacture a display device including a RED chip, a GREEN chip, and a BLUE chip.

Unlike the above-described FIGS. 11 and 12, according to FIG. 13, the RED chip, the GREEN chip, and the BLUE chip may be assembled on one assembly board (RGB integrated TEMPLATE). In this state, the RED chip, the GREEN chip, and the BLUE chip may be transferred to the wiring board by the same transfer board (RGB integrated stamp).

According to the manufacturing method of FIG. 13, one type of assembly board and one type of transfer board are required to manufacture a display device including a RED chip, a GREEN chip, and a BLUE chip.

As described above, when manufacturing a display device including semiconductor light emitting diodes that emit light of different colors, a manufacturing method thereof may be implemented in various ways.

The present disclosure relates to an assembly board having a structure capable of improving a decrease in an assembly rate of the semiconductor light emitting diodes due to electrode defects by in the self-assembly method described above by supplying voltage signals of specific polarities (positive (+) or negative (−) polarity) to assembly electrodes in two or more directions in the above-described self-assembly method and various embodiments of the present disclosure will be described with reference to the accompanying drawings.

First, the conventional assembly board structure and the shape of the electric field formed on the assembly board during self-assembly will be briefly described with reference to FIGS. 14 to 16.

FIG. 14 is a view showing the structure of a conventional assembly board, FIG. 15 is a conceptual diagram illustrating a form of an electric field formed between assembly electrodes, and FIG. 16 is a view showing an assembly state when an electrode defect occurs in a conventional assembly board.

The assembly board 161 is a board used in a method of manufacturing a display device, and specifically, may be a substrate used in a method of manufacturing a display device through self-assembly. Here, the self-assembly may be a display manufacturing method in which the semiconductor light emitting diodes 150 are seated at preset positions of the assembly board 161 using an electric field and a magnetic field.

The conventional assembly board 161 may include a base portion 161a, a dielectric layer 161b, a plurality of assembly electrodes 161c, cells 161d on which the semiconductor light emitting diodes 150 are mounted, and barrier ribs 161e.

The assembly electrodes 161c may extend in one direction and may be disposed in parallel on the base portion 161a, and the dielectric layer 161b may be disposed on the base portion 161a to cover the plurality of assembly electrodes 161c.

The barrier ribs 161e may be stacked on the dielectric layer 161b, and the barrier ribs 161e may be stacked on the dielectric layer 220 while forming the cells 161d on which the semiconductor light emitting diodes 150 are seated at predetermined intervals along the extending direction of the assembly electrodes 161c to overlap a part of the assembly electrode 230.

On the other hand, as a voltage is applied from the outside to the assembly electrode 161c, an electric field E1 may be formed inside the cell 161d as shown in FIG. 15, and the semiconductor light emitting diode 150 may be seated on the cell 161d due to the electric field E1. Voltage signals with different polarities may be applied to the adjacent assembly electrodes 161c to form the electric field E1, so that the electric field E1 may be formed in a region between the adjacent assembly electrodes 161c. The electric field E1 is stronger as it approaches the assembly electrodes 161c, and becomes weaker as it is away from the assembly electrodes 161c.

The assembly board 161 may include a voltage applying unit 170 that supplies a voltage to the assembly electrodes 161c as external power is applied to the assembly surface on which the assembly electrodes 161c are formed. The voltage applying unit 170 may include an electrode pad 171 connected to a power supply device (not shown) to receive power, and a bus line 172 connected to the electrode pad 171 and the assembly electrodes 161c to supply voltage to the assembly electrodes 161c.

The voltage applying unit 170 may be provided on both sides with respect to the extending direction of the assembly electrodes 161c. In this case, the voltage applying unit 170a provided on one side may apply a voltage of a positive (+) signal to the assembly electrodes 161c, and the voltage applying unit 170b provided on the other side is provided on the other side may apply a voltage of a negative (−) signal to the assembly electrodes 161c.

For example, in FIG. 14, the electrode pad 171a and the bus line 172a connected on the left side are configured to supply a voltage of a (+) signal to the assembly electrodes 161c, and the electrode pad 171b and the bus line 172b connected on the right side may be configured to supply a voltage of a (−) signal to the assembly electrodes 161c. That is, according to the structure of the conventional assembly board 161, a voltage could be applied to the assembly electrodes 161c only in one direction.

In this structure, as shown in FIG. 16, when an electrode defect (e.g., disconnection) occurs, a voltage signal of a specific polarity is not supplied, so that the semiconductor light emitting diode 150 cannot be seated inside the cell 161d. Specifically, when the assembly electrode 161c receiving the voltage of the (−) signal on the right side of the drawing is disconnected, the voltage of the (−) signal is not supplied in region A, and when the assembly electrode 161c receiving the voltage of the (+) signal on the left side of the drawing is disconnected, the electric field E1 is not formed in regions B and C to cause a problem in that the semiconductor light emitting diode 150 cannot be assembled.

Hereinafter, an assembly board having a structure in which voltage is applied to assembly electrodes in two or more directions according to an embodiment of the present disclosure will be described with reference to FIGS. 17 to 20.

FIG. 17 is a view showing a structure of an assembly board according to an embodiment of the present disclosure, FIG. 18 is a view showing a structure of an assembly board according to another embodiment of the present disclosure, FIG. 19 is a view showing an assembly state when an electrode defect occurs in an assembly board according to an embodiment of the present disclosure, and FIG. 20 is a graph showing a simulation analysis result for a voltage applied to a cell formed on an assembly board according to the related art and an embodiment of the present disclosure.

The assembly board 200 according to the embodiment of the present disclosure may include a base portion 210, a dielectric layer 220, a plurality of assembly electrodes 230, cells 240 and barrier ribs 161e in which semiconductor light emitting diodes 150 are seated, and a voltage applying unit 260 for applying a voltage to the assembly electrodes 230, like the conventional assembly board.

The plurality of assembly electrodes 230 may extend in one direction and may be disposed in parallel on the base portion 210 at predetermined intervals, and the assembly electrode 230 may include a protrusion protruding from one surface facing an adjacent assembly electrode 230. The protrusion may overlap the cell 240 and form a stronger electric field E1 inside the cell 240.

The dielectric layer 220 may be stacked on the base portion 210 to cover the plurality of assembly electrodes 230. The barrier ribs 161e may be stacked on the dielectric layer 220, and the barrier ribs 161e may be stacked on the dielectric layer 220 while forming the cells 240 on which the semiconductor light emitting diodes 150 are seated at predetermined intervals along the extending direction of the assembling electrodes 230 to overlap a portion of the assembly electrode 230.

As a voltage is applied to the assembly electrodes 230, the electric field E1 may be formed inside the cell 240 formed to overlap a portion of the assembly electrode 230, and the semiconductor light emitting diode 150 may be seated in the cell 240 due to the electric field E1.

According to an embodiment of the present disclosure, as shown in FIG. 17, the voltage applying units 260 may be provided on both sides of the assembly electrodes 230, respectively and may be connected to both ends of the assembly electrodes 230, respectively. That is, the assembly electrodes 230 may receive a voltage signal from the voltage applying units 260 connected to both ends, and voltages of the same polarity may be applied to each assembly electrode 230 from the voltage applying units 260 connected to both ends.

The voltage applying unit 260 may include an electrode pad 261 connected to an external power supply device (not shown) to receive power applied from the outside, and a bus line 262 connected to the electrode pad 261 and the assembly electrodes 230. One end of the bus line 262 may be connected to the electrode pad 261, and the other end may be connected to the plurality of assembly electrodes 230, and the bus line 262 may supply a voltage signal to the assembly electrodes 230 connected to the other end as power is applied to the electrode pad 261 connected to one end.

Specifically, the voltage applying unit 260 may include a first voltage applying unit 260a that applies a voltage of a (+) signal to the assembly electrodes 230 and a second voltage applying unit 260b that applies a voltage of a (−) signal to the assembly electrodes 230. The first voltage applying unit 260a may include a positive electrode pad 261a, and the second voltage applying unit 260b may include a negative electrode pad 261b.

In addition, the first voltage applying unit 260a and the second voltage applying unit 260b may be provided in the same number in the assembly board 200, and at least two first voltage applying units 260a and at least two second voltage applying units 260b may be provided in one assembly board 200. For example, the first voltage applying units 260a and the second voltage applying units 260b may be respectively connected to both ends of different assembly electrodes 230 and respectively provided on both sides of the assembly board 200 as shown in FIG. 17.

Meanwhile, voltage signals having different polarities may be supplied to adjacent assembly electrodes 230 among the plurality of assembly electrodes 230. Specifically, one of the adjacent assembly electrodes 230 may be connected to the first voltage applying unit 260a for supplying a (+) voltage signal, and the other may be connected to the second voltage applying unit 260b for supplying a (−) voltage signal. Accordingly, an electric field E1 may be formed between the adjacent assembly electrodes 230, and an electric field E1 is formed inside the cell 240 formed to overlap a part of the assembly electrode 230 to allow the semiconductor light emitting diode 150 to be seated inside the cell 240.

Also, one voltage applying unit 260 may be simultaneously connected to a plurality of assembly electrodes 230 receiving voltage signals of the same polarity. That is, the bus lines 262a and 262b are connected to one electrode pad 261a or 261b to which a voltage signal of a specific polarity is applied at one end, and the plurality of assembly electrodes 230 supplied with voltage signals of the same polarity may be connected in parallel to one bus line 262a or 262b that supplies the voltage signal of the specific polarity. Referring to FIG. 17, one end of the assembly electrodes 230 to which a (+) voltage signal is supplied may be connected in parallel with the bus line 262a connected to the positive electrode pad 261a, and one end of the assembly electrodes 230 to which a (−) voltage signal is supplied may be connected in parallel with the bus line 262b connected to the negative electrode pad 261b.

When voltage signals are applied to both ends of the assembly electrodes 230 as described above, even when the voltage signal supply in one direction is blocked due to an electrode defect, the voltage signal is supplied in the other direction, thus improving the self-assembly rate of the semiconductor light emitting diode 150.

In addition, according to the embodiment of the present disclosure, since the voltage signals are supplied in both directions of the assembly electrode 230, the resistance due to the length of the assembly electrode 230 is reduced by half due to shortening of a signal transmission path as compared to the conventional assembly board 161 in which a voltage is supplied in a single direction.

In FIG. 20, A is the waveform of the voltage applied to the assembly boards 161 and 200, and B and C are waveforms of voltages applied to the cells 240 and 161d respectively formed in assembly boards 200 and 161 according to the present disclosure and the prior art. In the case of the assembly board 200 according to the present disclosure, when voltage is supplied in both directions of the assembly electrode 230, the resistance due to the length of the assembly electrode 230 may be reduced by half, and a voltage signal close to the waveform of the voltage applied to the assembly board may be supplied to the cell 240 formed in the assembly board 200. In addition, the electric field E1 for assembling the semiconductor light emitting diode 150 may be more strongly formed inside the cell 240.

According to another embodiment of the present disclosure, the assembly board 200 may further include a voltage applying unit 260 connected to a region other than both ends of the assembly electrodes 230 as shown in FIG. 18. Specifically, the plurality of assembly electrodes 230 may be further connected to a voltage applying unit 260 that applies a voltage having the same polarity as that of the voltage applying unit 260 connected to both ends at an arbitrary position in the extending direction of the assembly electrode 230.

That is, the assembly electrodes 230 connected to the first voltage applying unit 260a and the assembly electrodes 230 connected to the second voltage applying unit 260b may be further connected to the first voltage applying unit 260a and the second voltage applying unit 260b at arbitrary positions in the extending direction thereof and may receive a voltage signal having a specific polarity in a direction crossing the extending direction of the assembly electrodes 230.

Preferably, the assembly electrodes 230 may be divided into a plurality of regions having the same length based on the arbitrary positions at which the voltage applying unit 260 is additionally connected. That is, the assembly electrodes 230 may be additionally connected to the voltage applying unit 260 at an intermediate point in the extending direction, and a voltage signal supplied from the additionally connected voltage applying unit 260 may be transmitted in both directions.

In addition, the assembly electrodes 230 may be additionally connected to the voltage applying unit 260 at two or more arbitrary positions in the extending direction.

In this way, the assembly electrodes 230 may be further connected to the voltage applying unit 260 at an arbitrary position in the extending direction in addition to the voltage applying unit 260 coupled to both ends to receive an additional voltage signal. In this case, resistance due to the length of the assembly electrode 230 may be further reduced. In addition, a voltage signal having a waveform close to the waveform of the voltage signal applied to the assembly board 200 may be supplied to the interior of the cell 240 in which the semiconductor light emitting diode 150 is seated.

According to the structure of the assembly board 200 according to the embodiment of the present disclosure as shown in FIG. 19, even when the voltage is not supplied in a specific direction due to the disconnection of the assembly electrode 230, the voltage signal of the same polarity may be supplied from the opposite side. Therefore, an electric field E1 may be formed inside the cell 240 and may not affect the assembly of the semiconductor light emitting diode 150.

Hereinafter, a display manufacturing method using the above-described assembly board 200 according to an embodiment of the present disclosure will be briefly described.

According to the present disclosure, the display device may be manufactured using the assembly board 200 having the above-described structure in the same manner as the conventional method of manufacturing the display device through self-assembly.

Specifically, the method of manufacturing a display device according to the present disclosure may include transferring the assembly board 200 having the above-described structure to an assembly position, and putting a plurality of semiconductor light emitting diodes 150 including a magnetic material into a fluid chamber; applying a magnetic force to the semiconductor light emitting diodes 150 put into the fluid chamber such that the semiconductor light emitting diodes 150 move in one direction, inducing the semiconductor light emitting diodes 150 to move to a preset position by applying an electric field such that the semiconductor light emitting elements 150 are seated at preset positions on the assembly board 200 while the semiconductor light emitting elements 150 are moving; and transferring the semiconductor light emitting diodes 150 seated on the assembly board 200 to the final substrate on which wirings are formed.

In the assembly board 200 used in the manufacturing method of the present disclosure, a plurality of assembly electrodes 230 for forming an electric field E1 are arranged on an assembly surface at predetermined intervals, and the plurality of assembly electrodes 230 are respectively connected to the voltage applying units 260 at both ends thereof to receive a voltage signal for forming the electric field E1 at both ends of the assembly electrodes 230. Also, a voltage signal of a specific polarity (+ or −) may be applied to each of the assembly electrodes 230.

In addition, voltage signals of different polarities may be supplied to adjacent assembly electrodes among the plurality of assembly electrodes 230 to form an electric field E1 in a region between the adjacent assembly electrodes. A preset position at which the semiconductor light emitting diode 150 is seated may overlap a region between adjacent assembly electrodes, in which the electric field E1 is formed.

Meanwhile, the voltage applying unit 260 may include an electrode pad 261 to which external power is applied and a bus line 262 connected to the electrode pad 261 and the plurality of assembly electrodes 230 to supply a voltage signal to the assembly electrodes 230. The voltage applying unit 260 may be formed on the same assembly surface as the assembly electrodes 230, and when the semiconductor light emitting diode moves to the assembly position, a portion where the electrode pad 261 is formed is held to block contact between the electrode pad 261 and fluid.

Meanwhile, the transferring of the semiconductor light emitting diodes 150 seated on the assembly board 200 to the final substrate on which wirings are formed may include two or more transfer processes. The semiconductor light emitting diodes 150 seated on the assembly board 200 may be transferred to a transfer board (or a transfer stamp) before being transferred to the final substrate and then transferred to a final substrate, and the process may be repeated multiple times.

The present disclosure described above is not limited to the configuration and method of the above-described embodiments, but the embodiments may be configured by selectively combining all or part of embodiments such that various modifications can be made.

The invention claimed is:

1. An assembly board for use in a display manufacturing method for allowing semiconductor light emitting diodes to be seated at preset positions on the assembly board using an electric field and a magnetic field, the assembly board comprising:
   a base portion;
   a plurality of assembly electrodes extending in one direction and disposed on the base portion at predetermined intervals;
   a dielectric layer stacked on the base portion to cover the plurality of assembly electrodes;
   barrier ribs stacked on the dielectric layer and defining cells in which semiconductor light emitting diodes are seated at the predetermined intervals along an extending direction of the plurality of assembly electrodes so as to overlap a portion of the plurality of assembly electrodes; and
   a voltage applying unit connected to at least opposite ends of the plurality of assembly electrodes to apply one or more voltage signals to the plurality of assembly electrodes,
   wherein a voltage signal of the same polarity is applied to the plurality of assembly electrodes from the voltage applying unit connected to the opposite ends.

2. The assembly board of claim 1, the voltage applying unit includes:
   an electrode pad to which power is applied from outside; and
   a bus line connected to the electrode pad and the plurality of assembly electrodes to supply a voltage signal to the connected plurality of assembly electrodes when power is applied to the electrode pad.

3. The assembly board of claim 2, wherein the voltage applying unit includes a first voltage applying unit including a positive electrode pad and a second voltage applying unit including a negative electrode pad,
   wherein the assembly board includes the same number of first voltage applying units and second voltage applying units.

4. The assembly board of claim 3, wherein one of adjacent assembly electrodes is connected to the first voltage applying unit and the other of the adjacent assembly electrodes is connected to the second voltage applying unit such that voltage signals of different polarities are supplied to the adjacent assembly electrodes of the plurality of assembly electrodes.

5. The assembly board of claim 1, wherein the voltage applying unit is connected to the plurality of assembly electrodes that receive the voltage signal of the same polarity.

6. The assembly board of claim 1, wherein the plurality of assembly electrodes are further connected to a voltage applying unit that applies a voltage signal having the same polarity as that of the voltage applying unit connected to the opposite ends at an arbitrary position in the extending direction of the assembly electrodes.

7. The assembly board of claim 6, wherein the plurality of assembly electrodes are divided into a plurality of regions having the same length based on the arbitrary position.

8. A method for manufacturing a display device, the method comprising
transferring an assembly board to an assembly position and putting a plurality of semiconductor light emitting diodes including a magnetic material into a fluid chamber;
applying a magnetic force to the plurality of semiconductor light emitting diodes that are put into the fluid chamber to move the plurality of semiconductor light emitting diodes in one direction;
inducing the plurality of semiconductor light emitting diodes to move to preset positions on the assembly board by applying an electric field that the plurality of semiconductor light emitting diodes are seated at the preset positions on the assembly board while the plurality of semiconductor light emitting diodes are moving in the one direction; and
transferring the plurality of semiconductor light emitting diodes seated on the assembly board to a final board on which wirings are formed,
wherein a plurality of assembly electrodes for forming the electric field are arranged on the assembly board at predetermined intervals, and a voltage signal of the same polarity is applied to the plurality of assembly electrodes at least at opposite ends thereof.

9. The method of claim 8, wherein voltage signals of different polarities are supplied to adjacent assembly electrodes among the plurality of assembly electrodes to form the electric field in a region between the adjacent assembly electrodes.

10. The method of claim 9, wherein the preset positions at which the plurality of semiconductor light emitting diodes are seated overlap the region between the adjacent assembly electrodes where the electric field is formed.

11. The method of claim 9, wherein the voltage signals of different polarities are supplied to adjacent assembly electrodes at opposite ends of the plurality of assembly electrodes.

12. The assembly board of claim 4, wherein the first voltage applying unit is connected to a first bus line and a first pad, and the second voltage applying unit is connected to a second bus line and a second pad, and
wherein the first bus line intersects the other of the adjacent assembly electrodes, and the second bus line intersects the one of adjacent assembly electrodes.

13. The assembly board of claim 4, the voltage signals of different polarities are supplied to the adjacent assembly electrodes of the plurality of assembly electrodes from the same side end of the plurality of assembly electrodes.

14. The assembly board of claim 1, wherein a disconnection is present in one of the plurality of assembly electrodes so that the voltage signal of the same polarity is not communicated at the disconnection.

15. An assembly board to seat semiconductor light emitting diodes at preset positions on the assembly board, the assembly board comprising:
a plurality of assembly electrodes extending in one direction at predetermined intervals;
a dielectric layer on the base portion to cover the plurality of assembly electrodes;
barrier ribs on the dielectric layer and defining cells at the preset positions; and
a voltage applying unit connected to at least opposite ends of the plurality of assembly electrodes to apply voltage signals to the plurality of assembly electrodes,
wherein the voltage supplying unit includes a first pad and a first bus line connected to one of adjacent assembly electrodes of the plurality of electrodes, and a second pad and a second bus line connected to another of adjacent assembly electrodes of the plurality electrodes, and
wherein the first bus line intersects the another of the adjacent assembly electrodes.

16. The assembly board of claim 15, wherein the second bus line intersects the one of adjacent assembly electrodes.

17. The assembly board of claim 15, wherein a voltage signal of the same polarity is applied to the plurality of assembly electrodes from the voltage applying unit connected to the opposite ends.

18. The assembly board of claim 15, further comprising the semiconductor light emitting diodes seated at the predetermined intervals along an extending direction of the plurality of assembly electrodes so as to overlap a portion of the plurality of assembly electrodes.

19. The assembly board of claim 15, wherein the voltage signals of different polarities are supplied to the adjacent assembly electrodes of the plurality of assembly electrodes from the same side end of the plurality of assembly electrodes.

20. The assembly board of claim 15, wherein a disconnection is present in one of the plurality of assembly electrodes.

* * * * *